(12) United States Patent
Clark et al.

(10) Patent No.: US 11,942,581 B2
(45) Date of Patent: *Mar. 26, 2024

(54) SEMICONDUCTOR DEVICE WITH TRANSMISSIVE LAYER AND MANUFACTURING METHOD THEREOF

(71) Applicant: Amkor Technology Singapore Holding Pte. Ltd., Singapore (SG)

(72) Inventors: David Clark, Ipswich (GB); Curtis Zwenger, Chandler, AZ (US)

(73) Assignee: AMKOR TECHNOLOGY SINGAPORE HOLDING PTE. LTD., Singapore (SG)

(*) Notice: Subject to any disclaimer, the term of this patent is extended or adjusted under 35 U.S.C. 154(b) by 0 days.

This patent is subject to a terminal disclaimer.

(21) Appl. No.: 17/902,035

(22) Filed: Sep. 2, 2022

(65) Prior Publication Data

US 2023/0074157 A1    Mar. 9, 2023

Related U.S. Application Data

(63) Continuation of application No. 17/026,752, filed on Sep. 21, 2020, now Pat. No. 11,437,552, which is a
(Continued)

(51) Int. Cl.
*H01L 33/58*    (2010.01)
*H01L 21/56*    (2006.01)
(Continued)

(52) U.S. Cl.
CPC ............ *H01L 33/58* (2013.01); *H01L 21/563* (2013.01); *H01L 21/6835* (2013.01);
(Continued)

(58) Field of Classification Search
CPC ..... H01L 33/58; H01L 21/6835; H01L 24/16; H01L 24/32
(Continued)

(56) References Cited

U.S. PATENT DOCUMENTS 3,462,349 A    8/1969    Gorgenyi
3,868,724 A    2/1975    Perrino
(Continued)

FOREIGN PATENT DOCUMENTS

CN    205514542    8/2016
JP    05-109975    4/1993
(Continued)

OTHER PUBLICATIONS

CAD_CIM Requirements Article IMAPS, Sep./Oct. 1994.
(Continued)

*Primary Examiner* — Quoc D Hoang
(74) *Attorney, Agent, or Firm* — McAndrews, Held & Malloy, Ltd.

(57) ABSTRACT

A method for manufacturing a semiconductor device and a semiconductor device produced thereby. For example and without limitation, various aspects of this disclosure provide a method for manufacturing a semiconductor device, and a semiconductor device produced thereby, that that comprises a transparent, translucent, non-opaque, or otherwise optically-transmissive, external surface.

20 Claims, 14 Drawing Sheets

Related U.S. Application Data continuation of application No. 16/686,516, filed on Nov. 18, 2019, now Pat. No. 10,784,422, which is a continuation of application No. 15/947,245, filed on Apr. 6, 2018, now Pat. No. 10,490,716, which is a continuation of application No. 15/256,970, filed on Sep. 6, 2016, now Pat. No. 9,960,328.

(51) Int. Cl.
 H01L 21/683 (2006.01)
 H01L 23/00 (2006.01)
 H01L 33/44 (2010.01)
 H01L 33/62 (2010.01)

(52) U.S. Cl.
 CPC .............. *H01L 24/00* (2013.01); *H01L 33/44* (2013.01); *H01L 24/16* (2013.01); *H01L 24/32* (2013.01); *H01L 24/73* (2013.01); *H01L 24/92* (2013.01); *H01L 33/62* (2013.01); *H01L 2221/68345* (2013.01); *H01L 2224/13101* (2013.01); *H01L 2224/16225* (2013.01); *H01L 2224/73204* (2013.01); *H01L 2224/73253* (2013.01); *H01L 2224/81005* (2013.01); *H01L 2224/81203* (2013.01); *H01L 2224/81224* (2013.01); *H01L 2224/81815* (2013.01); *H01L 2224/92125* (2013.01); *H01L 2924/00014* (2013.01); *H01L 2924/15311* (2013.01); *H01L 2924/18161* (2013.01); *H01L 2924/3511* (2013.01)

(58) Field of Classification Search
 USPC ......................................................... 257/98
 See application file for complete search history.

(56) References Cited

U.S. PATENT DOCUMENTS

| | | |
|---|---|---|
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | Maciver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Ojennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,715,292 A | 2/1998 | Sayag et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,841,193 A | 11/1998 | Eichelberger |
| 5,847,453 A | 12/1998 | Uematsu et al. |
| 5,883,425 A | 3/1999 | Kobayashi |
| 5,894,108 A | 4/1999 | Mostafazadeh et al. |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,051,888 A | 4/2000 | Dahl |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,137,062 A | 10/2000 | Zimmerman |
| 6,157,080 A | 12/2000 | Tamaki et al. |
| 6,159,767 A | 12/2000 | Eichelberger |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Pan chou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,294,408 B1 | 9/2001 | Edwards et al. |
| 6,307,161 B1 | 10/2001 | Grube et al. |
| 6,316,285 B1 | 11/2001 | Jiang et al. |
| 6,329,609 B1 | 12/2001 | Kaja et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |

(56) References Cited

U.S. PATENT DOCUMENTS

| | | |
|---|---|---|
| 6,451,509 B2 | 9/2002 | Keesler et al. |
| 6,479,762 B2 | 11/2002 | Kusaka |
| 6,486,005 B1 | 11/2002 | Kim |
| 6,486,554 B2 | 11/2002 | Johnson |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,573,598 B2 | 6/2003 | Ohuchi et al. |
| 6,577,013 B1 | 6/2003 | Glenn et al. |
| 6,583,445 B1 | 6/2003 | Reedy et al. |
| 6,586,682 B2 | 7/2003 | Strandberg |
| 6,608,382 B2 | 8/2003 | Liu et al. |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,576 B2 | 4/2004 | Hedler |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,765,287 B1 | 7/2004 | Lin |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,845,554 B2 | 1/2005 | Frankowsky et al. |
| 6,888,240 B2 | 5/2005 | Towle et al. |
| 6,905,914 B1 | 6/2005 | Huemoeller et al. |
| 6,919,514 B2 | 7/2005 | Konrad et al. |
| 6,921,968 B2 | 7/2005 | Chung |
| 6,921,975 B2 | 7/2005 | Leale et al. |
| 6,931,726 B2 | 8/2005 | Boyko et al. |
| 6,943,436 B2 | 9/2005 | Radu et al. |
| 6,953,995 B2 | 10/2005 | Farnworth et al. |
| 6,967,403 B2 | 11/2005 | Chuang et al. |
| 6,982,225 B2 | 1/2006 | Bohr |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,112,882 B2 | 9/2006 | Lee |
| 7,119,432 B2 | 10/2006 | Desai et al. |
| 7,125,744 B2 | 10/2006 | Takehara et al. |
| 7,185,426 B1 | 3/2007 | Hiner et al. |
| 7,192,807 B1 | 3/2007 | Huemoeller et al. |
| 7,196,408 B2 | 3/2007 | Yang et al. |
| 7,198,980 B2 | 4/2007 | Jiang et al. |
| 7,202,107 B2 | 4/2007 | Fuergut et al. |
| 7,215,026 B2 | 5/2007 | Park et al. |
| 7,238,602 B2 | 7/2007 | Yang |
| 7,242,081 B1 | 7/2007 | Lee |
| 7,247,523 B1 | 7/2007 | Huemoeller et al. |
| 7,262,081 B2 | 8/2007 | Yang et al. |
| 7,262,082 B1 | 8/2007 | Lin et al. |
| 7,282,394 B2 | 10/2007 | Cho et al. |
| 7,285,855 B2 | 10/2007 | Foong |
| 7,326,592 B2 | 2/2008 | Meyer et al. |
| 7,339,279 B2 | 3/2008 | Yang |
| 7,345,361 B2 | 3/2008 | Mallik et al. |
| 7,361,987 B2 | 4/2008 | Leal |
| 7,372,151 B1 | 5/2008 | Fan et al. |
| 7,405,102 B2 | 7/2008 | Lee et al. |
| 7,420,272 B1 | 9/2008 | Huemoeller et al. |
| 7,429,786 B2 | 9/2008 | Karnezos et al. |
| 7,459,202 B2 | 12/2008 | Magera et al. |
| 7,459,781 B2 | 12/2008 | Yang et al. |
| 7,548,430 B1 | 6/2009 | Huemoeller et al. |
| 7,550,857 B1 | 6/2009 | Longo et al. |
| 7,623,733 B2 | 11/2009 | Hirosawa |
| 7,633,765 B1 | 12/2009 | Scanlan et al. |
| 7,642,133 B2 | 1/2010 | Wu et al. |
| 7,671,457 B1 | 3/2010 | Hiner et al. |
| 7,675,131 B2 | 3/2010 | Derderian |
| 7,750,454 B2 | 7/2010 | Carson et al. |
| 7,777,351 B1 | 8/2010 | Berry et al. |
| 7,781,883 B2 | 8/2010 | Sri-Jayantha et al. |
| 7,825,520 B1 | 11/2010 | Longo et al. |
| 7,902,660 B1 | 3/2011 | Lee et al. |
| 7,928,562 B2 | 4/2011 | Arvelo et al. |
| 7,948,095 B2 | 5/2011 | Ng et al. |
| 7,960,827 B1 | 6/2011 | Miller et al. |
| 7,982,298 B1 | 7/2011 | Kang et al. |
| 7,993,983 B1 | 8/2011 | Lin |
| 8,003,515 B2 | 8/2011 | Meyer et al. |
| 8,004,095 B2 | 8/2011 | Shim et al. |
| 8,008,770 B2 | 8/2011 | Lin et al. |
| 8,035,123 B2 | 10/2011 | Yan et al. |
| 8,058,726 B1 | 11/2011 | Jin et al. |
| 8,067,268 B2 | 11/2011 | Carson et al. |
| 8,106,500 B2 | 1/2012 | Chow |
| 8,222,538 B1 | 7/2012 | Yoshida et al. |
| 8,258,015 B2 | 9/2012 | Chow et al. |
| 8,269,348 B2 | 9/2012 | Fazelpour |
| 8,288,201 B2 | 10/2012 | Pagaila |
| 8,341,835 B1 | 1/2013 | Huemoeller et al. |
| 8,362,695 B2 | 1/2013 | Aanegola |
| 8,471,154 B1 | 6/2013 | Yoshida et al. |
| 8,471,376 B1 | 6/2013 | Liou et al. |
| 8,471,394 B2 | 6/2013 | Jang et al. |
| 8,508,954 B2 | 8/2013 | Kwon et al. |
| 8,536,462 B1 | 9/2013 | Darveaux et al. |
| 8,552,556 B1 | 10/2013 | Kim et al. |
| 8,604,615 B2 | 12/2013 | Lee et al. |
| 8,618,648 B1 | 12/2013 | Kwon et al. |
| 8,624,374 B2 | 1/2014 | Ding et al. |
| 8,643,163 B2 | 2/2014 | Shim et al. |
| 8,674,513 B2 | 3/2014 | Yu et al. |
| 8,759,147 B2 | 6/2014 | Choi et al. |
| 8,773,866 B2 | 7/2014 | Jin et al. |
| 8,829,678 B2 | 9/2014 | Lee et al. |
| 8,946,883 B2 | 2/2015 | Kim et al. |
| 8,981,550 B2 | 3/2015 | Park et al. |
| 9,000,586 B2 | 4/2015 | Do et al. |
| 9,012,789 B1 | 4/2015 | Yoshida et al. |
| 9,048,125 B2 | 6/2015 | Paek et al. |
| 9,064,718 B1 | 6/2015 | Muniandy et al. |
| RE45,642 E | 8/2015 | Takada |
| 9,543,242 B1 | 1/2017 | Kelly et al. |
| 9,754,982 B2 | 9/2017 | Yu |
| 9,960,328 B2 | 5/2018 | Clark et al. |
| 10,490,716 B2 | 11/2019 | Clark et al. |
| 10,784,422 B2 * | 9/2020 | Clark ...................... H01L 33/58 |
| 11,437,552 B2 * | 9/2022 | Clark ...................... H01L 33/58 |
| 2002/0011657 A1 | 1/2002 | Saito |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0135057 A1 | 9/2002 | Kurita |
| 2002/0195697 A1 | 12/2002 | Mess et al. |
| 2003/0025199 A1 | 2/2003 | Wu et al. |
| 2003/0102546 A1 | 6/2003 | Lee |
| 2003/0128096 A1 | 7/2003 | Mazzochette |
| 2003/0141582 A1 | 7/2003 | Yang et al. |
| 2003/0164540 A1 | 9/2003 | Lee |
| 2003/0197284 A1 | 10/2003 | Khiang et al. |
| 2004/0036183 A1 | 2/2004 | Im et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2004/0165362 A1 | 8/2004 | Farnworth |
| 2004/0238402 A1 | 12/2004 | Yunus |
| 2004/0262774 A1 | 12/2004 | Kang et al. |
| 2005/0001331 A1 * | 1/2005 | Kojima ............... H01L 23/3121 |
| | | 257/E23.128 |
| 2005/0056928 A1 | 3/2005 | Kwon et al. |
| 2005/0062154 A1 | 3/2005 | Duchesne et al. |
| 2005/0073605 A1 | 4/2005 | Burns |
| 2005/0133928 A1 | 6/2005 | Howard et al. |
| 2005/0133932 A1 | 6/2005 | Pohl et al. |
| 2005/0134507 A1 | 6/2005 | Dishongh et al. |
| 2005/0139985 A1 | 6/2005 | Takahashi |

(56) References Cited

U.S. PATENT DOCUMENTS

| | | |
|---|---|---|
| 2005/0242425 A1 | 11/2005 | Leal et al. |
| 2006/0065964 A1 | 3/2006 | Ohsumi |
| 2006/0079019 A1 | 4/2006 | Kim |
| 2006/0192301 A1 | 8/2006 | Leal et al. |
| 2006/0208351 A1 | 9/2006 | Poo et al. |
| 2006/0231958 A1 | 10/2006 | Yang |
| 2006/0258044 A1 | 11/2006 | Meyer et al. |
| 2007/0059866 A1 | 3/2007 | Yang et al. |
| 2007/0064395 A1 | 3/2007 | Chen et al. |
| 2007/0069389 A1 | 3/2007 | Wollanke et al. |
| 2007/0080757 A1 | 4/2007 | Yahata et al. |
| 2007/0126085 A1 | 6/2007 | Kawano et al. |
| 2007/0132104 A1 | 6/2007 | Farnworth et al. |
| 2007/0273049 A1 | 11/2007 | Khan et al. |
| 2007/0281471 A1 | 12/2007 | Hurwitz et al. |
| 2007/0287265 A1 | 12/2007 | Hatano et al. |
| 2007/0290376 A1 | 12/2007 | Zhao et al. |
| 2008/0105967 A1 | 5/2008 | Yang et al. |
| 2008/0128884 A1 | 6/2008 | Meyer et al. |
| 2008/0142960 A1 | 6/2008 | Leal |
| 2008/0175939 A1 | 7/2008 | Danovitch et al. |
| 2008/0182363 A1 | 7/2008 | Amrine et al. |
| 2008/0230887 A1 | 9/2008 | Sun et al. |
| 2008/0246133 A1 | 10/2008 | Derderian |
| 2008/0290492 A1 | 11/2008 | Chung et al. |
| 2008/0290496 A1 | 11/2008 | Park |
| 2009/0008765 A1 | 1/2009 | Yamano et al. |
| 2009/0051025 A1 | 2/2009 | Yang et al. |
| 2009/0085201 A1 | 4/2009 | Mathew |
| 2009/0243073 A1 | 10/2009 | Carson et al. |
| 2009/0289343 A1 | 11/2009 | Chiu et al. |
| 2009/0309206 A1 | 12/2009 | Kim et al. |
| 2010/0007002 A1 | 1/2010 | Pendse |
| 2010/0007032 A1 | 1/2010 | Gallegos |
| 2010/0020503 A1 | 1/2010 | Beaumier et al. |
| 2010/0130000 A1 | 5/2010 | Sutou et al. |
| 2010/0140772 A1 | 6/2010 | Lin et al. |
| 2010/0140779 A1 | 6/2010 | Lin et al. |
| 2010/0144091 A1 | 6/2010 | Kawano et al. |
| 2010/0167451 A1 | 7/2010 | Derderian |
| 2010/0181665 A1 | 7/2010 | Casey et al. |
| 2010/0208432 A1 | 8/2010 | Bhagwagar et al. |
| 2010/0327439 A1 | 12/2010 | Hwang et al. |
| 2011/0031598 A1 | 2/2011 | Lee et al. |
| 2011/0057327 A1 | 3/2011 | Yoshida et al. |
| 2011/0062592 A1 | 3/2011 | Lee et al. |
| 2011/0062602 A1 | 3/2011 | Ahn et al. |
| 2011/0068427 A1 | 3/2011 | Paek et al. |
| 2011/0068478 A1 | 3/2011 | Pagaila et al. |
| 2011/0084382 A1 | 4/2011 | Chen et al. |
| 2011/0204505 A1 | 8/2011 | Pagaila et al. |
| 2011/0227223 A1 | 9/2011 | Wu et al. |
| 2011/0233782 A1 | 9/2011 | Chang et al. |
| 2011/0237026 A1 | 9/2011 | Farooq et al. |
| 2011/0254156 A1 | 10/2011 | Lin |
| 2012/0056329 A1 | 3/2012 | Pagaila et al. |
| 2012/0061855 A1 | 3/2012 | Do et al. |
| 2012/0069683 A1 | 3/2012 | Kamata et al. |
| 2012/0074585 A1 | 3/2012 | Koo et al. |
| 2012/0088332 A1 | 4/2012 | Lee et al. |
| 2012/0094443 A1 | 4/2012 | Pratt et al. |
| 2012/0153453 A1 | 6/2012 | Ankireddi et al. |
| 2012/0168917 A1 | 7/2012 | Yim et al. |
| 2012/0178152 A1 | 7/2012 | Bauer et al. |
| 2012/0326307 A1 | 12/2012 | Jeong et al. |
| 2012/0326324 A1 | 12/2012 | Lee et al. |
| 2013/0017643 A1 | 1/2013 | Lin et al. |
| 2013/0037942 A1 | 2/2013 | Hwang et al. |
| 2013/0040427 A1 | 2/2013 | Hu et al. |
| 2013/0052775 A1 | 2/2013 | Kim et al. |
| 2013/0062786 A1 | 3/2013 | Leung et al. |
| 2013/0075924 A1 | 3/2013 | Lin et al. |
| 2013/0078765 A1 | 3/2013 | Lin et al. |
| 2013/0078915 A1 | 3/2013 | Zhao et al. |
| 2013/0082399 A1 | 4/2013 | Kim et al. |
| 2013/0134559 A1 | 5/2013 | Lin et al. |
| 2013/0168849 A1 | 7/2013 | Scanlan |
| 2013/0175702 A1 | 7/2013 | Choi et al. |
| 2013/0187292 A1 | 7/2013 | Semmel Meyer et al. |
| 2013/0214402 A1 | 8/2013 | Park et al. |
| 2013/0241039 A1 | 9/2013 | Choi et al. |
| 2013/0309814 A1 | 11/2013 | Too et al. |
| 2013/0320517 A1 | 12/2013 | Shirley |
| 2013/0328192 A1 | 12/2013 | Lee et al. |
| 2014/0048906 A1 | 2/2014 | Shim et al. |
| 2014/0061888 A1 | 3/2014 | Lin et al. |
| 2014/0061893 A1 | 3/2014 | Saeidi et al. |
| 2014/0077366 A1 | 3/2014 | Kim et al. |
| 2014/0084456 A1 | 3/2014 | Kang et al. |
| 2014/0124949 A1 | 5/2014 | Paek |
| 2014/0131856 A1 | 5/2014 | Do |
| 2014/0131886 A1 | 5/2014 | Paek et al. |
| 2014/0138817 A1 | 5/2014 | Paek et al. |
| 2014/0147970 A1 | 5/2014 | Kim et al. |
| 2014/0167087 A1* | 6/2014 | Wada ............... H01L 24/73 438/27 |
| 2014/0210109 A1 | 7/2014 | Tanaka et al. |
| 2014/0217610 A1 | 8/2014 | Jeng et al. |
| 2014/0217619 A1 | 8/2014 | Zhao et al. |
| 2014/0231635 A1* | 8/2014 | Kerness ......... H01L 31/02325 250/226 |
| 2014/0246779 A1 | 9/2014 | Lin et al. |
| 2014/0264933 A1 | 9/2014 | Yu et al. |
| 2014/0284785 A1 | 9/2014 | Sung et al. |
| 2014/0319661 A1 | 10/2014 | Pagaila |
| 2014/0327145 A9 | 11/2014 | Pagaila et al. |
| 2015/0017764 A1 | 1/2015 | Lin et al. |
| 2015/0021791 A1 | 1/2015 | Park |
| 2015/0036970 A1 | 2/2015 | Lai |
| 2015/0125993 A1 | 5/2015 | Lee et al. |
| 2015/0137384 A1 | 5/2015 | Huemoeller et al. |
| 2015/0234137 A1 | 8/2015 | Kuo et al. |
| 2015/0235991 A1 | 8/2015 | Gu et al. |
| 2015/0318262 A1 | 11/2015 | Gu |
| 2016/0013148 A1 | 1/2016 | Lin et al. |
| 2016/0064328 A1 | 3/2016 | Kwon et al. |
| 2016/0071779 A1 | 3/2016 | Chen |
| 2016/0212852 A1 | 7/2016 | Hu et al. |
| 2016/0218239 A1* | 7/2016 | Gubser ............. H01L 27/14618 |
| 2016/0276174 A1 | 9/2016 | Kim et al. |
| 2016/0296117 A1 | 10/2016 | Hu |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |
| JP | 2001-118947 | 10/1999 |
| JP | 2005-333052 | 12/2005 |
| JP | 2006-073622 | 3/2006 |
| JP | 2006147835 | 6/2006 |
| JP | 2007-043090 | 2/2007 |
| KR | 10-1997-005712 | 4/1997 |
| KR | 20-0412028 | 3/2006 |
| KR | 1020060050579 | 5/2006 |
| KR | 10-0787894 | 12/2007 |
| KR | 10-2009-0100895 | 9/2009 |
| KR | 10-0990939 | 11/2010 |
| KR | 10-1056749 | 8/2011 |
| KR | 1020120053332 | 5/2012 |
| KR | 10-1151258 | 6/2012 |
| KR | 10-2012-0100299 | 9/2012 |
| KR | 1020130092208 | 8/2013 |
| KR | 20140030014 | 3/2014 |
| TW | 201444048 | 11/2014 |

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(56) References Cited

OTHER PUBLICATIONS

Kim et al., "Application of Through Mold Via (TMV) as PoP base package", 58.sup.th ECTC Proceedings, May 2008, Lake Buena Vista, FL, 6 pages, IEEE.
Scanlan, "Package-on-package (POP) with Through-mold Vias", Advanced Packaging, Jan. 2008, 3 pages, vol. 17, Issue 1, PennWell Corporation.
Zohni, Wael (Invensas Corporation), Ultra high-bandwidth POP infrastructure development, 4 pages, Nov.-Dec. 2013.
Invensas™ BVA PoP for Mobile Computing: Untra-High 10 without TSVs, 4 pages, Jun. 26, 2012.
Taiwanese Office Action for Application No. 109101705, 8 pages.
Chinese Office Action for Application No. 201610963417, dated Nov. 11, 2022, 16 pages.
Chinese Office Action for Application No. 201610963417, dated Mar. 17, 2023, 26 pages (with English translation).
Korean Office Action for Application No. 10-2016-0151014, dated Nov. 11, 2023, 7 pages (with English translation).

\* cited by examiner

US 11,942,581 B2

SEMICONDUCTOR DEVICE WITH TRANSMISSIVE LAYER AND MANUFACTURING METHOD THEREOF

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1A:
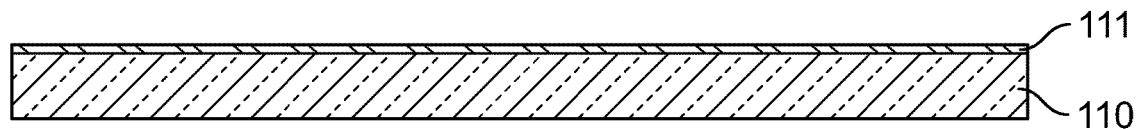
FIGS. 1A to 1J show cross-sectional views illustrating a method of manufacturing a semiconductor device, in accordance with various aspects of the present disclosure.

Various aspects of this disclosure provide a method for manufacturing a semiconductor device and a semiconductor device produced thereby. For example and without limitation, various aspects of this disclosure provide a method for manufacturing a semiconductor device, and a semiconductor device produced thereby, that comprises a transparent, translucent, non-opaque, or otherwise optically-transmissive, external surface.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure. Additionally, the term "on" will be utilized in the document to mean both "on" and "directly on" (e.g., with no intervening layer).

Various aspects of the present disclosure provide a semiconductor device comprising a transparent, translucent, non-opaque, or otherwise optically-transmissive, external carrier, wafer, or layer and a manufacturing method thereof. As utilized herein, the term "optically-transmissive" refers to a characteristic of a material that permits passage of light through the material. Furthermore, unless otherwise qualified, the term "light" is used to refer to electromagnetic radiation in the visible light spectrum, i.e., 400-790 terahertz (THz), as well as electromagnetic radiation in the near-infrared light spectrum, i.e., 120-400 THz, and near-ultraviolet light spectrum, i.e., 790-1000 THz.

In the drawings, various dimensions (e.g., layer thickness, width, etc.) may be exaggerated for illustrative clarity. Additionally, like reference numbers are utilized to refer to like elements through the discussions of various examples.

The discussion will now refer to various example illustrations provided to enhance the understanding of the various aspects of the present disclosure. It should be understood that the scope of this disclosure is not limited by the specific characteristics of the examples provided and discussed herein.

Cross-sectional views illustrating a method of manufacturing a semiconductor device 100, in accordance with various aspects of the present disclosure, are shown in FIGS. 1A to 1J. The example manufacturing method may, for example, comprise providing a carrier 110 with a first dielectric layer 111, forming a first conductive layer 121, forming a second conductive layer 123 and an under bump metal 125, attaching a first wafer support system (WSS) 1, removing the carrier 110, forming an opening 111a in the first dielectric layer 111, forming a pad or micro bump pad 126 (hereinafter pad 126) at the opening 111a, attaching a semiconductor die 130 and molding with a mold material 140 (e.g., a resin, encapsulant, molding compound, etc.), separating the first WSS 1, attaching an optically-transmissive layer 170 (e.g., a wafer, a panel, a singulated component of a wafer or panel, etc.) and a second wafer support system (WSS) 2, attaching a conductive interconnection structure 160, and separating the second WSS 2.

As shown in FIG. 1A, a carrier 110 with a first dielectric layer 111 is formed or provided. In particular, the carrier 110 may provide a planar top surface and a planar bottom surface. The carrier 110 (or any carrier discussed herein) may comprise any of a variety of different types of carrier materials. The carrier 110 may, for example, comprise a semiconductor material (e.g., silicon, GaAs, etc.), glass, ceramic (e.g., porous ceramic, etc.), metal, etc. The carrier 110 may also comprise any of a variety of different types of configurations. For example, the carrier 110 may be in a mass form (e.g., a wafer form, a rectangular panel form, etc.). Also for example, the carrier 110 may be in a singular form (e.g., singulated from a wafer or panel, originally formed in a singular form, etc.). The carrier 110 may, for example, share any or all characteristics with any carrier discussed herein.

A first dielectric layer 111 such as, for example, an inorganic dielectric layer (e.g., a silicon oxide layer, a silicon nitride layer, oxide layer, nitride layer, etc.) may be (or may have been) formed on the surface of the carrier 110. For example, the first dielectric layer 111 may have been (or may be) formed through an oxidation process. For example, a silicon oxide layer and/or silicon nitride layer of a predetermined thickness may be formed by supplying oxygen gas and/or nitride gas to a silicon wafer at a temperature of approximately 900° C. or higher (e.g., a thermal oxidation process, etc.). The first dielectric layer 111, or a portion thereof, may also comprise a native oxide layer naturally formed on the carrier 110 without manufacturing process assistance. The first dielectric layer 111 may also be referred to herein as a protective layer. The first dielectric layer 111 may, for example, be from 0.01 to 0.8 microns thick.

In comparison to a polymer layer that is an organic material, a layer of inorganic material (e.g., a silicon oxide layer, a silicon nitride layer, etc.) may allow (or assist) a photoetching process to be performed more accurately, so that a conductive layer of a relatively finer line/space/thickness (e.g., trace width, spacing between adjacent traces, and/or trace thickness) may be formed on the layer of inorganic material. For example, a conductive layer with a line/space/thickness of about 2/2/2 micrometers (μm) to about 10/10/10 μm may be formed on a layer of inorganic material (e.g., on a silicon oxide (or silicon dioxide) layer, silicon nitride layer, oxide layer, nitride layer, etc.). The scope of the present disclosure is not limited to inorganic dielectric materials. For example, in various example implementations, the dielectric layer 111 may comprise an organic material. Additionally, the carrier 110 need not be provided with the dielectric layer 111.

Figure 1B:
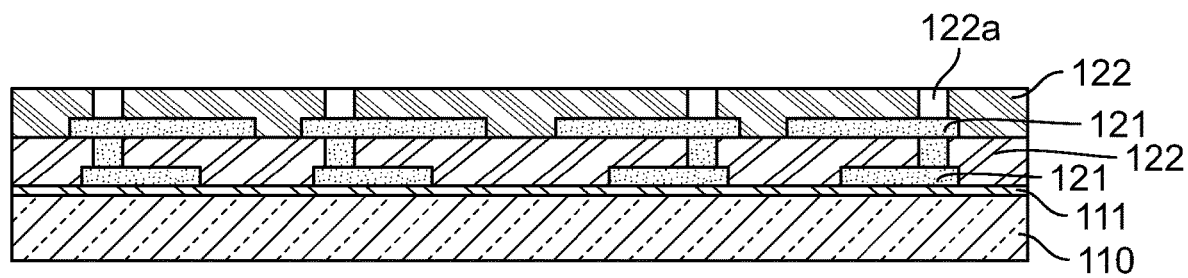

As shown in FIG. 1B, a first conductive layer 121, which may also be referred to herein as a redistribution layer, may be formed on the first dielectric layer 111. In one example implementation, a first seed layer (not shown) may be formed on the first dielectric layer 111, and the first conductive layer 121 may be formed on the first seed layer. The first conductive layer 121 may then be covered with a second dielectric layer 122, which may also be referred to herein as a passivation layer.

The first seed layer and/or any seed layer discussed herein may be formed of any of a variety of materials, including but not limited to tungsten, titanium, equivalents thereof, combinations thereof, alloys thereof, etc. The first seed layer may be formed utilizing any of a variety of processes. For example, the first seed layer may be formed utilizing one or more of an electroless plating process, an electrolytic plating process, a sputtering process, etc. For example, the first seed layer may be formed of TiW with a Cu target. The first seed layer and/or any seed layer discussed herein may also be referred to as a conductive layer. Also, any seed layer discussed herein may be formed utilizing the same or similar materials and/or processes, or may be formed utilizing different respective materials and/or processes. Additionally, the first seed layer and/or any seed layer discussed herein may comprise multiple layers. As an example, the first seed layer may comprise a first TiW layer and a second Cu layer.

The first conductive layer 121 may be formed of any of a variety of materials. For example, the first conductive layer 121 may be formed of copper, aluminum, gold, silver, palladium, equivalents thereof, combinations thereof, alloys thereof, other conductive materials, etc. The first conductive layer 121 may, for example, be formed utilizing any of a variety of processes. For example, the first conductive layer 121 may be formed utilizing one or more of an electroless plating process, an electrolytic plating process, a sputtering process, etc. The patterning or routing of the first conductive layer 121 may, for example, be accomplished utilizing any of a variety of processes. For example, the first conductive layer 121 may be patterned or routed utilizing a photoetching process using a photoresist, etc. For example, photoresist may be spin coated (or otherwise applied, such as a dry film, etc.) on a seed layer. The photoresist may then be set using, for example, a masking and illumination process. Then portions of the photoresist may be etched away, residual photoresist may be removed in a descum process, and drying (e.g., spin rinse drying) may be performed to form a template of photoresist. After forming the first conductive layer 121, the template may be stripped (e.g., chemically stripped, etc.), and the first seed layer that is exposed from the first conductive layer 121 may be etched.

The first conductive layer 121 and/or any conductive layer discussed herein may also be referred to as a redistribution layer. Also, any conductive layer discussed herein may be formed utilizing the same or similar materials and/or processes, or may be formed utilizing different respective materials and/or processes. Additionally, the first conductive layer 121, and/or the forming thereof, may share any or all characteristics with any other conductive layer, and/or the forming thereof, disclosed herein.

The second dielectric layer 122 may be formed of any of a variety of materials. For example, the second dielectric layer 122 may be formed of an organic material (e.g., polymers such as polyimide, Benzocyclobutene (BCB), Polybenzoxazole (PBO), equivalents thereof, combinations thereof, etc.). Also for example, the second dielectric layer 122 may be formed of an inorganic material. The second dielectric layer 122 may be formed utilizing any of a variety of processes. For example, the second dielectric layer 122 may be formed utilizing one or more of spin coating, spray coating, dip coating, rod coating, equivalents thereof, combinations thereof, etc. The second dielectric layer 122 and/or any dielectric layer discussed herein may also be referred to as a passivation layer. Also, any dielectric layer discussed herein may be formed utilizing the same or similar materials and/or processes, or may be formed utilizing different respective materials and/or processes. Additionally, the second dielectric layer 121, and/or the forming thereof, may share any or all characteristics with any other dielectric layer, and/or the forming thereof, disclosed herein.

As discussed herein, in an example implementation, since the first conductive layer 121, with or without an underlying seed layer, may be formed on the inorganic first dielectric layer 111 (e.g., directly on the inorganic first dielectric layer 111), it may be formed or more easily formed to have a finer line/space/thickness in comparison to other conductive layers, which may be formed on organic dielectric layers.

Formation of the first conductive layer 121, with or without a seed layer, and the second dielectric layer 122 may be repeated any number of times utilizing the same materials and/or processes or different respective materials and/or processes. The example illustrations in FIGS. 1B-1J show two formations of such layers. As such, the layers are provided with similar labels in the figures (e.g., repeating the first conductive layer 121 and the second dielectric layer 122).

An opening or aperture 122a may be formed in the second dielectric layer 122, and a specific area of the first conductive layer 121 may be exposed to the outside through the opening 122a. The opening 122a may be formed in any of a variety of manners (e.g., mechanical and/or laser ablation, chemical etching, photolithography, etc.). The second dielectric layer 122 (or any dielectric layer discussed herein) may also be originally formed having opening 122a, for example by masking, or other selective dielectric layer formation process.

Figure 1C:
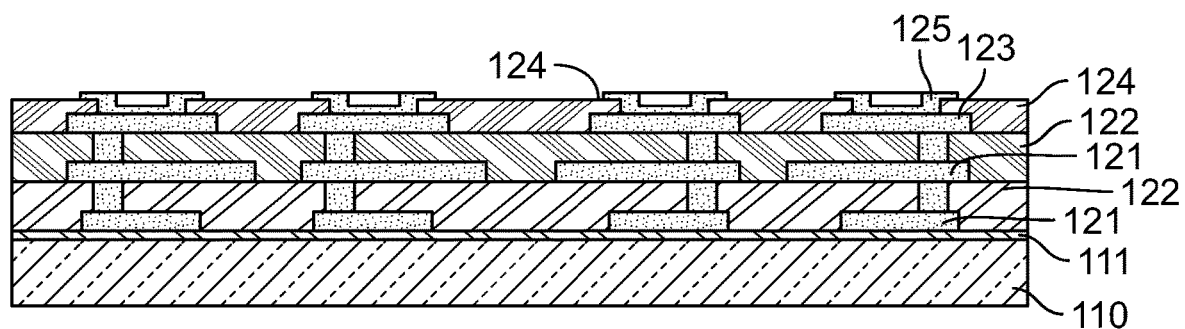

As shown in FIG. 1C, a second conductive layer 123 and an under bump metal 125 of at least one layer may be formed on the first conductive layer 121 and/or on the second dielectric layer 122. In one example implementation, a second seed layer (not shown) may be formed at the inside of the opening 122a such as, for example, on side walls of the opening 122a formed in the second dielectric layer 122 and/or on the first conductive layer 121 exposed by the opening 122a. In addition to or alternatively, the second seed layer may be formed outside of the opening 122a such as, for example, on the top surface of the second dielectric layer 122. As discussed herein, the second seed layer may be formed using the same materials and/or processes as used to form the first seed layer, or may be formed using different respective materials and/or processes. The second seed layer or any seed layer discussed herein may also be referred to herein as a conductive layer.

Continuing the example implementation, the second conductive layer 123 may be formed on the second seed layer. For example, the second conductive layer 123 may be formed to fill or at least cover side surfaces of the opening 122a in the second dielectric layer 122. The second conductive layer 123 may be formed using the same materials and/or processes as the first conductive layer 121, or may be formed using different respective materials and/or processes. The second conductive layer 123 may also be referred to herein as a redistribution layer.

The second conductive layer 123 may then be covered with the third dielectric layer 124. The third dielectric layer 124 may be formed of any of a variety of materials and/or utilizing any of a variety of dielectric-forming processes. For example, the third dielectric layer 124 may be formed utilizing the same materials and/or processes as utilized to form the second dielectric layer 122.

An opening or aperture 124a may be formed in the third dielectric layer 124, and a specific area of the second conductive layer 123 may be exposed to the outside through the opening 124a. The opening 124a may be formed in any of a variety of manners such as, for example, mechanical and/or laser ablation, chemical etching, etc. Alternatively, the third dielectric layer 124 may be originally formed with the opening 124a therein.

An under bump seed layer (not shown) may be formed inside of the opening 124a such as, for example, on side walls of the opening 124a formed in the third dielectric layer 124 and/or on the second conductive layer 123 exposed by the opening 124a. Alternatively or additionally, the under bump seed layer may be formed outside of the opening 124a such as, for example, on the top surface of the third dielectric layer 124 around and/or encircling the opening 124a. As discussed herein, the under bump seed layer may be formed using the same materials and/or processes as used to form the first seed layer and/or the second seed layer, or may be formed using different respective materials and/or processes. The under bump seed layer or any seed layer discussed herein may also be referred to herein as a conductive layer.

An under bump metal 125 may be formed on the under bump seed layer. The under bump metal 125 may be formed of any of a variety of materials, non-limiting examples of which are presented herein. For example, the under bump metal 125 may be formed of at least one of chrome, nickel, palladium, gold, silver, alloys thereof, combinations thereof, equivalents thereof, etc. The under bump metal 125 may, for example, comprise Ni and Au. Then under bump metal 125 may also, for example, comprise Cu, Ni, and Au. The under bump metal 125 may be also formed utilizing any of a variety of processes, non-limiting examples of which are presented herein. For example, the under bump metal 125 may be formed utilizing one or more of an electroless plating process, electroplating process, sputtering process, etc. The under bump metal 125 may, for example, prevent or inhibit the formation of an intermetallic compound at the interface between the conductive interconnection structure 160 and the second conductive layer 123, thereby improving the reliability of the connection to the conductive interconnection structure 160. The under bump metal 125 may also be referred to herein as a conductive layer. The under bump metal 125 may comprise multiple layers. For example, the under bump metal 125 may comprise a first layer of Ni and a second layer of Au.

Though not illustrated in FIGS. 1A-1J, following formation of the under bump metal 125, an edged trim (or profile) process may be performed, for example in which an edge of the wafer being processed is trimmed (or profiled). Such trimming may be performed in a variety of manners, for example by grinding. Such edge trimming may, for example, protect the wafer from chipping and flaking during subsequent processing.

For discussion purposes herein, the first conductive layer 121, the second dielectric layer 122, the second conductive layer 123, and the third dielectric layer 124 may be considered to be components of an interposer 120. Furthermore, the under bump metal 125 and the pad 126 described herein may also be considered to be components of the interposer 120. The term "interposer" is used herein to refer to a general redistribution structure (e.g., a dielectric and conductor layered structure) that is interposed between other structures, and the scope of this disclosure should not be limited or defined by arbitrary notions regarding interposer composition.

Figure 1D:
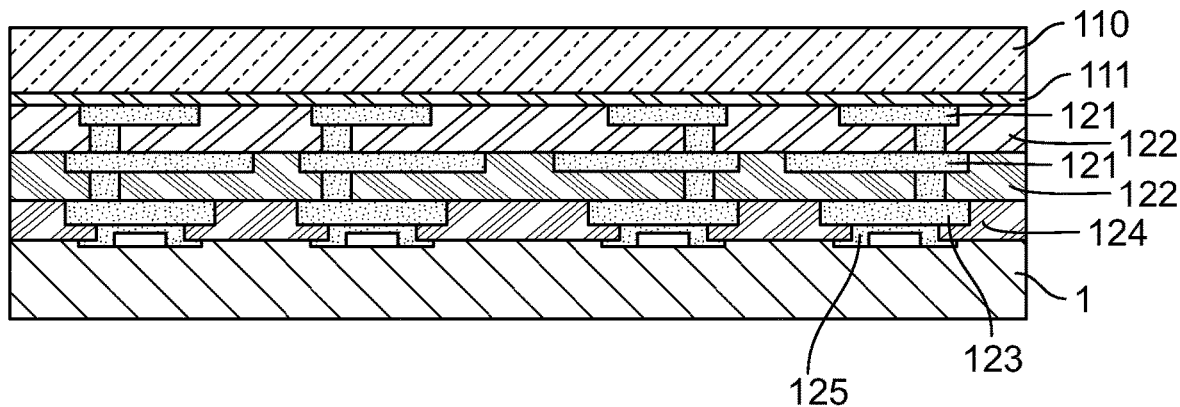

As shown in FIG. 1D, the first WSS 1 may be attached to the third dielectric layer 124 and the under bump metal 125. At this point, the carrier 110 that is shown at the bottom of FIG. 1C is repositioned to the top of FIG. 1D (e.g., the diagram is inverted or rotated). The first WSS 1 may be attached to the third dielectric layer 124 and/or to the under bump metal 125 in any of a variety of manners, non-limiting examples of which are provided herein. For example, the first WSS 1 (or any WSS discussed herein) may be attached to the third dielectric layer 124 and/or to the under bump metal 125 utilizing a temporary adhesive that loses its adhesion when exposed to thermal energy or light energy, when exposed to particular chemicals, etc. One or more additional release layers may also be utilized to ease subsequent release of the first WSS 1. The attachment process may, for example, comprise baking the assembly (e.g., at 250° for 30 mins, etc.). The first WSS 1 may be formed from any of a variety of materials. For example, the first WSS 1 (or any WSS discussed herein) may be formed from one or more of a silicon wafer, a glass wafer, a ceramic wafer, a metal wafer, etc. Though the first WSS 1 is generally presented herein in the form of a wafer, the scope of this disclosure is not limited to such shape.

Figure 1E:
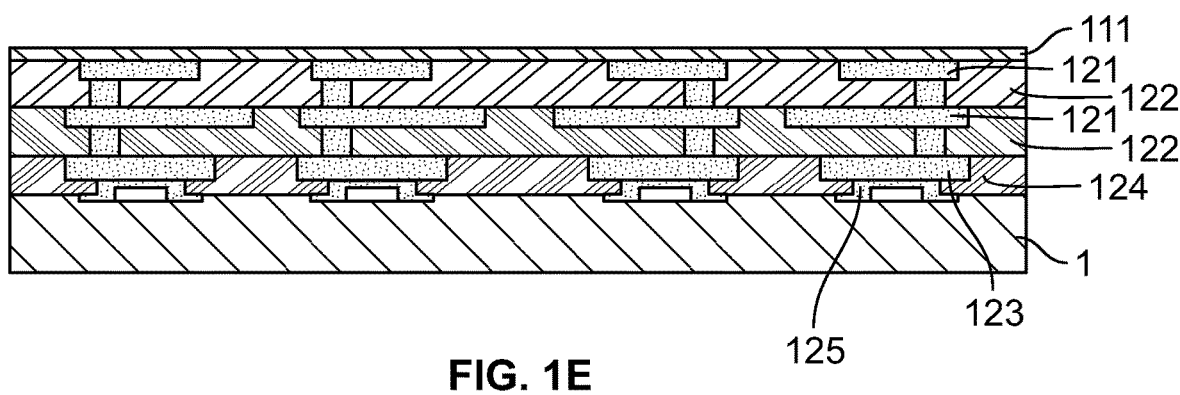

As shown in FIG. 1E, the carrier 110 (for example, a silicon wafer on which the first dielectric layer 111 was formed) on a side of the structure opposite the first WSS 1 may be removed. In an example implementation, most of the carrier 110 may be removed through a mechanical grinding process and then, the remaining carrier 110 may be removed through a chemical etching process. For example, a silicon carrier may be ground to 10-30 um thickness, and then the remainder may be removed by a process other than grinding (e.g., by chemical etching, etc.). In another example scenario in which the first WSS 1 comprises a glass wafer or plate, such glass wafer or plate is removed. In such a manner, as a result, only the first dielectric layer 111 (for example, a silicon oxide layer and/or a silicon nitride layer) formed on the surface of the carrier 110 remains. For example, as illustrated in FIG. 1E, only the first dielectric layer 111 of a predetermined thickness remains on the first conductive layer 121 and the second dielectric layer 122. The carrier removal process may also remove a portion (or all) of the first dielectric layer 111; for example, the first dielectric layer 111 may be thinner after removal of the carrier 110 than when originally formed on the carrier 110. In an example implementation, the first dielectric layer 111 may be formed of an inorganic material, and the second and third dielectric layers 122 and 124 may be formed of an organic material. However, the scope of the present disclosure is not limited to such example types of material.

Figure 1F:
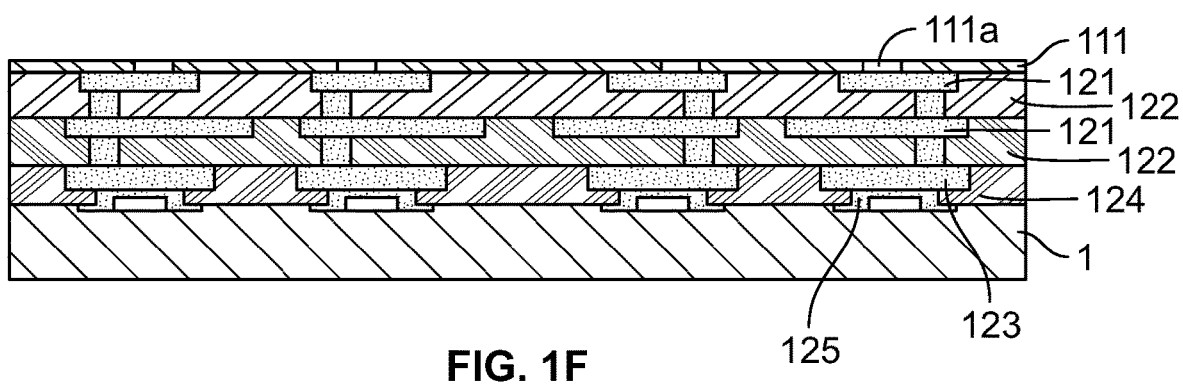

As shown in FIG. 1F, a plurality of openings 111a (or apertures) may be selectively formed in the first dielectric layer 111. The openings 111a may be formed in any of a variety of manners (e.g., mechanical and/or laser ablation, chemical etching, photo etching process, photo-masking and etching process, etc.). Each of the openings 111a may, for example, correspond to a respective specific area of the first conductive layer 121 exposed to the outside by the opening 111a. In an example implementation, an opening 111a exposes a respective specific area of the first conductive layer 121 to the outside through the inorganic first dielectric layer 111. In an example implementation, in which the first conductive layer 121 was formed on a first seed layer, a specific area of the first seed layer, on which the first conductive layer 121 was formed, may be exposed to the outside through the inorganic first dielectric layer 111. In an example scenario, in which a dielectric layer or passivation layer mask is utilized during a process of etching the openings 111a, the dielectric layer may be stripped after such etching, but may also remain in some embodiments as a passivation layer.

Figure 1G:
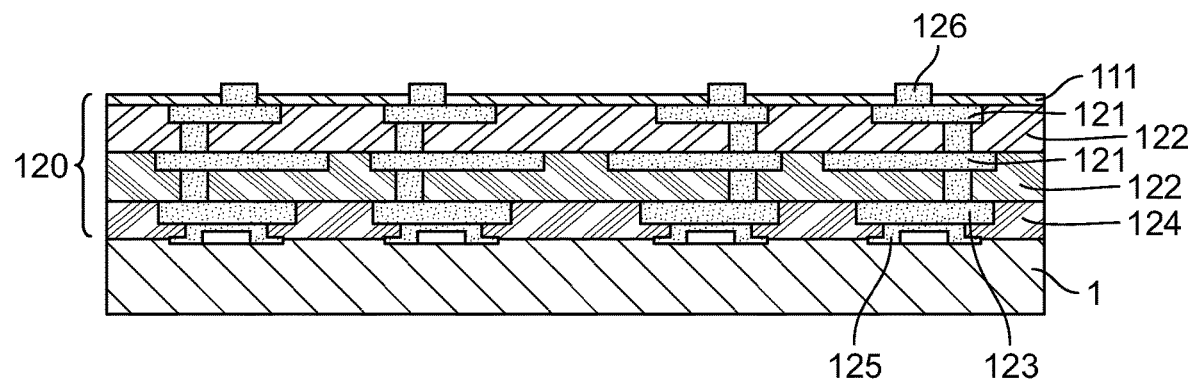

As shown in FIG. 1G, micro bump pads, other pads, lands, attachment structures, or die attachment structures 126 may be formed in the openings 111a so that each pad 126 is electrically connected to the first conductive layer 121 (e.g., directly connected, connected via a seed layer, etc.). In an example implementation, a micro bump seed layer (not shown) may be formed inside of the opening 111a such as, for example, on side walls of the opening 111a formed in the first dielectric layer 111 and/or on the first conductive layer 121. Alternatively or additionally, the micro bump seed layer may be formed outside of the opening 111a such as, for example, on the top surface of the first dielectric layer 111 surrounding the opening 111a. The micro bump seed layer may be formed utilizing the same materials and/or processes discussed herein with regard to other seed layers or conductive layers, or may be formed utilizing different respective materials and/or processes. The micro bump seed layer and/or pad 126 may also be referred to herein as a conductive layer.

The pad 126 may then be formed on the micro bump seed layer. In an example implementation, the first seed layer, on which the first conductive layer 121 was formed, and the micro bump seed layer, on which the pad 126 was formed, may be interposed between the first conductive layer 121 and the pad 126. For example, the first seed layer and the micro bump seed layer may be directly connected to each other or mutually facing each other. In various example implementations, the forming of the micro bump seed layer might be skipped, and the pad 126 may be formed on the first seed layer exposed through the opening 111a.

The pad 126 may comprise any of a variety of materials, non-limiting examples of which are provided herein. For example, the pad 126 may comprise copper, aluminum, gold, silver, palladium, general conductive material, conductive material, equivalents thereof, combinations thereof, alloys thereof, any conductive material discussed herein, etc. In an example implementation, the pad 126 may comprise Ni and Au. In another example implementation, the pad 126 may comprise Ni, Au, and Cu. The pad 126 may be formed utilizing any of a variety of processes, non-limiting examples of which are provided herein. For example, the pad 126 may be formed utilizing one or more of an electroless plating process, an electrolytic plating process, a sputtering process, etc.

The pad 126 is shown in FIG. 1G extending past (or protruding from) the top surface of the first dielectric layer 111, but the scope of this disclosure is not limited thereto. For example, the pad 126 may comprise a top surface that is coplanar with the top surface of the first dielectric layer 111, or may comprise a top surface that is below the top surface of the first dielectric layer 111. Though generally shown comprising a cylindrical shape, the pad 126 may comprise any of a variety of geometric configurations, various non-limiting examples of which are provided herein.

The pad 126 may alternatively be formed in an aperture in the first dielectric layer 111 near the beginning of the overall process shown in FIGS. 1A-1J. For example, between FIGS. 1A and 1B, an aperture may be formed in the first dielectric layer 111 (if such layer exists) and the pad 126 may be formed on the carrier 110 in such aperture before formation of the first conductive layer 121 thereon.

Figure 1H:
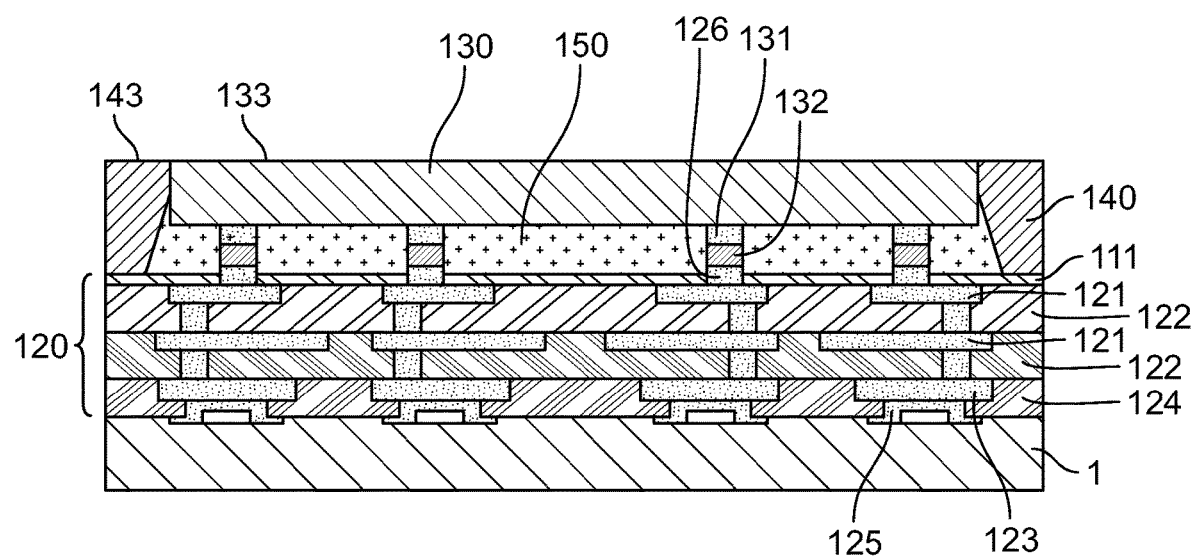

As shown in FIG. 1H, the semiconductor die 130 may be electrically connected to the pad 126 and may be molded with the mold material 140. For example, the conductive bump 131 (or other conductive attachment structure, for example conductive pillar, etc.) of the semiconductor die 130 is electrically connected to the pad 126 through the solder 132. In some embodiments, the term "bump" may collectively refer to a conductive bump or pillar 131 and solder 132 on the pillar 131. The conductive bump 131 of the semiconductor die 130 may be attached to the pad 126 in any of a variety of manners, non-limiting examples of which are presented herein. For example, the conductive bump 131 may be soldered to the pad 126 utilizing any of a variety of solder attachment processes (e.g., a mass reflow process, a thermal compression process, a laser soldering process, etc.). Also for example, the conductive bump 131 may be coupled to the pad 126 utilizing a conductive adhesive, paste, etc. Additionally for example, the conductive bump 131 may be coupled to the pad 126 utilizing a direct metal-to-metal (e.g., solderless) bond. In an example scenario, a solder paste may be applied to the pad 126 utilizing a stencil and squeegee, the conductive bump 131 of the semiconductor die 130 may be positioned on or in the solder paste (e.g., utilizing a pick-and-place process), and the solder paste may then be reflowed. After attachment of the semiconductor die 130, the assembly may be cleaned (e.g., with hot DI water, etc.), subjected to a flux clean and bake process, subjected to a plasma treatment process, etc.

In an example implementation, an underfill 150 may be formed between the semiconductor die 130 and the first dielectric layer 111, for example surrounding portions of the conductive bumps 131 and pads 126 that are exposed to (and thus encapsulated by) the underfill 150. The underfill 150 may comprise any of a variety of underfill materials. Also the underfill 150 may be formed utilizing any of a variety of processes (e.g., a capillary underfilling process, utilizing a pre-applied underfill material, etc.). The underfill 150 between the semiconductor die 130 and the interposer 120 (as various layers are illustratively grouped in FIG. 1H) may, for example, prevent or reduce warpage, for example due to thermal expansion coefficient difference between the semiconductor die 130 and the interposer 120.

In the molding (or encapsulating) process, the semiconductor die 130 and/or interposer 120 may be encapsulated with a mold material 140 (e.g., a molding resin or other mold material or encapsulant), which may then be cured. In an example implementation, the mold material 140 may cover the side surfaces and top surface of the semiconductor die 130. In another example implementation, the mold material 140 may only cover the side surfaces of the semiconductor die 130 (or only respective portions thereof), thus leaving the top surface of the semiconductor die 130 exposed from the mold material 140. The mold material 140 may be formed in any of a variety of manners (e.g., compression molding, transfer molding, flood molding, etc.). The mold material 140 may comprise any of a variety of types of mold material. For example, the mold material 140 may comprise a resin, an epoxy, a thermosetting epoxy molding compound, a room temperature curing type, etc.

When the size of a filler (e.g., in inorganic filler or other particle component) of the mold material 140 is smaller (or substantially smaller) than the size of a space or a gap between the interposer 120 and the semiconductor die 130, the underfill 150 might not be utilized, and the mold material 140 may instead fill a space or gap between the interposer 120 and the semiconductor die 130. In such an example scenario, the underfilling process and the molding process may be combined into a single molding process with a molded underfill.

The semiconductor die 130, for example, may comprise any of a variety of types of semiconductor die, non-limiting examples of which are provided herein. For example, the semiconductor die 130 may comprise a digital signal processor (DSP), a microcontroller, a microprocessor, a network processor, a power management processor, an audio processor, a video processor, an RF circuit, a wireless baseband system-on-chip (SoC) processor, a sensor, an application specific integrated circuit, etc. One or more passive electrical components may also be mounted instead of and/or in addition to the semiconductor die 130.

Figure 1I:
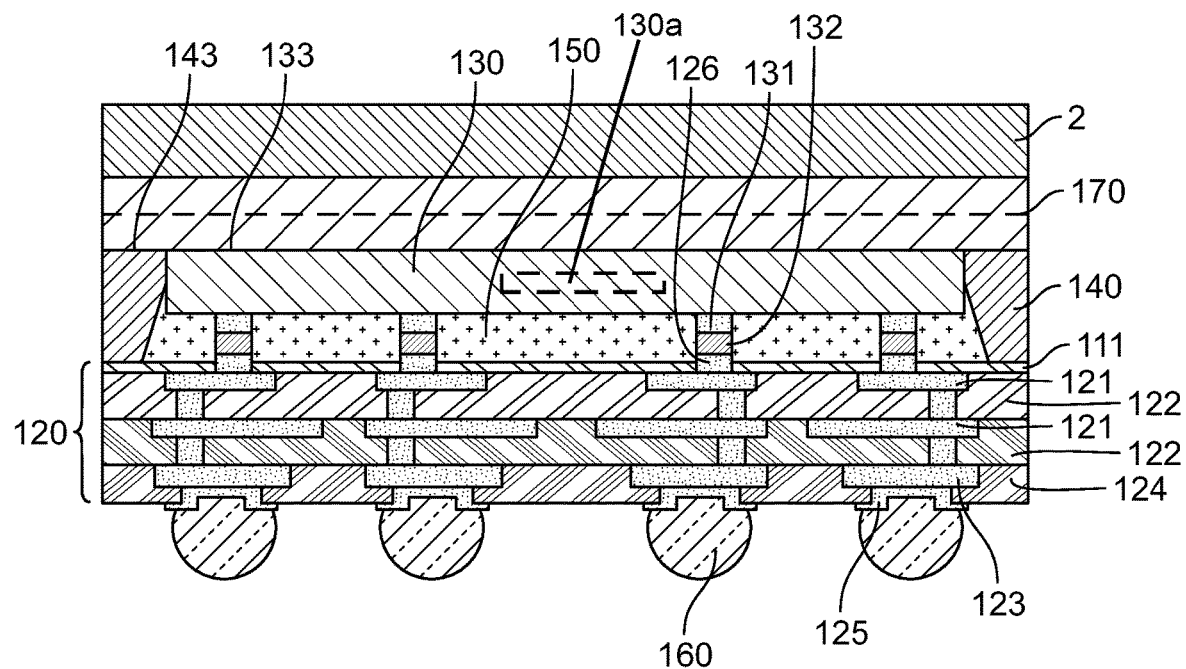

As shown in FIG. 1I, an optically transmissive layer 170 may be attached to the semiconductor die 130 and/or mold material 140 and a second WSS 2 may be attached to the optically transmissive layer 170. The optically transmissive layer 170 may include lenses to direct, guide, or focus light, antireflective layers or coatings that provide light antireflective properties, polarization layers or coatings that provide light polarization properties, color filter layers or coatings that provide color filtering properties, and/or layers of materials with different refractive indices in order to provide an upper or top surface 133 of the semiconductor die 130 with desired optical properties. For example, the semiconductor die 130 may comprise optical sensors, optical receivers, optical transmitters, or other optical devices 130a that transmit, receive, detect, and/or sense light. The optically transmissive layer 170 may help guide or may simply permit passage of light to and/or from such optical devices of the semiconductor 130.

As further shown in FIG. 1I, a second WSS 2 may be attached to the optically-transmissive layer 170. For example, the second WSS 2 may share any or all characteristics with the first WSS 1. The second WSS 2 may, for example, be attached in a similar manner as the first WSS 1 (e.g., utilizing a temporary adhesive, vacuum, mechanical attachment mechanism, etc.).

After attachment of the second WSS 2, the first WSS 1 may be separated from the third dielectric layer 124 and/or under bump metal 125. As discussed herein, the first WSS 1 may have been attached to the third dielectric layer 124 and/or to the under bump metal 125 utilizing a temporary adhesive that loses it adhesion (or a substantial portion thereof) when exposed to thermal energy, laser (or light) energy, chemical agents, etc. The separation of the first WSS 1 from the third dielectric layer 124 and/or under bump metal 125 may, for example, be performed by exposing the temporary adhesive to the energy and/or chemicals that cause the adhesive to loosen. In an example scenario in which a release layer was utilized to attach a glass WSS 1, the release layer (e.g., between the adhesive and the first WSS 1) may be subjected to laser (or light) irradiation through the glass WSS 1, to effect or assist with the release of the first WSS 1 from the adhesive. Other forms of wafer support system attachment/detachment may be utilized (e.g., vacuum attachment, mechanical attachment, etc.). Adhesive utilized to attach the first WSS 1 may, for example, be removed with a solvent if necessary.

The conductive interconnection structure 160 (or a plurality thereof) may be electrically connected to the exposed under bump metal 125 (e.g., exposed after removal of the first WSS 1). At this point, for example while the optically-transmissive layer 2 is attached to the semiconductor die 130 and the mold material 140, the conductive interconnection structure 160 may be electrically connected to the under bump metal 125.

The conductive interconnection structure 160 may comprise any of a variety of characteristics, non-limiting examples of which are presented herein. For example, the conductive interconnection structure 160 may be formed of one of a eutectic solder (Sn37Pb), a high lead solder (Sn95Pb), a lead-free solder (SnAg, SnAu, SnCu, SnZn, SnZnBi, SnAgCu, and SnAgBi), combination thereof, equivalents thereof, etc. The conductive interconnection structure 160 (and/or any conductive interconnection structure discussed herein) may, for example, comprise a conductive ball (e.g., a solder ball, a copper-core solder ball, etc.), a conductive bump, a conductive pillar or post (e.g., a copper pillar, a solder-capped copper pillar, a wire, etc.), etc.

The conductive interconnection structure 160 may, for example, be connected to the under bump metal 125 utilizing any of a variety of reflow and/or plating processes. For example, volatile flux may be deposited (e.g., dotted, printed, etc.) on the under bump metal 125, the conductive interconnection structure 160 may be deposited (e.g., dropped, etc.) on the volatile flux, and then a reflow temperature of about 150° C. to about 250° C. may be provided. At this point, the volatile flux may, for example, be volatized and completely removed.

The conductive interconnection structure 160, as mentioned above, may be referred to as a conductive bump, a conductive ball, a conductive pillar, a conductive post, a conductive wire, etc., and may, for example, be mounted on a rigid printed circuit board, a flexible printed circuit board, a lead frame, etc. For example, the semiconductor die 130 including the interposer 120 may then be electrically connected (e.g., in a flip-chip form or similar to a flip-chip form, etc.) to any of a variety of substrates (e.g., motherboard substrates, packaging substrates, lead frame substrates, etc.).

Figure 1J:
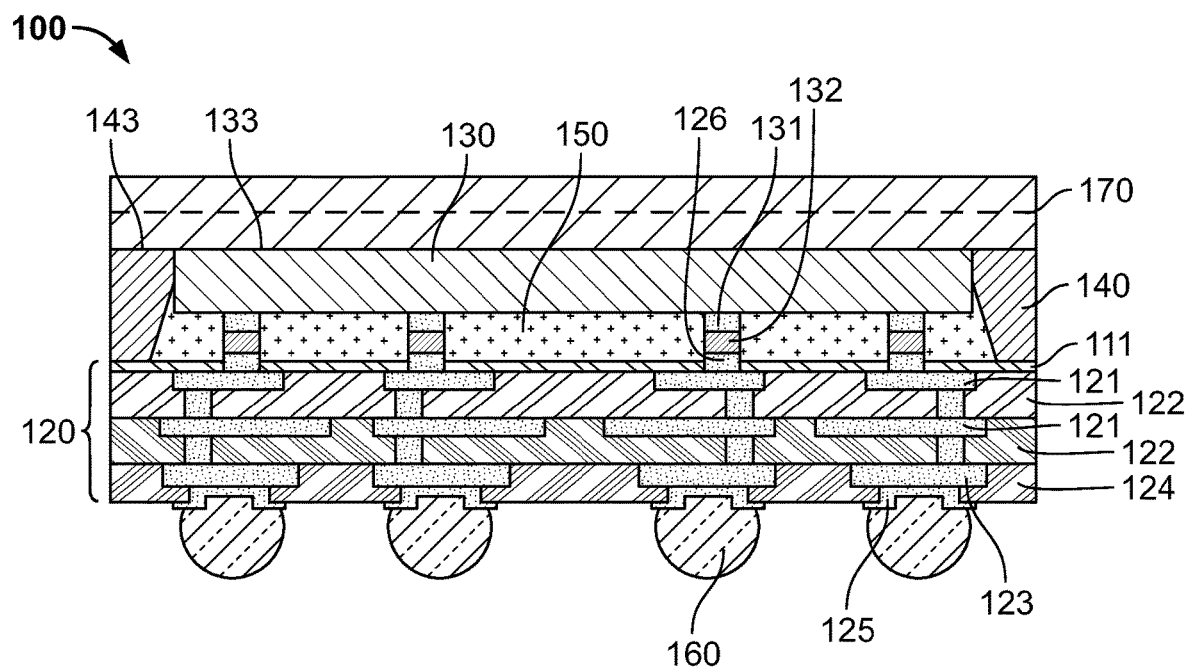

As shown in FIG. 1J, the second WSS 2 may be separated from the optically-transmissive layer 170. For example, in the completed semiconductor device 100, the top surface 153 of the optically-transmissive layer 170 may be exposed to the outside. Furthermore, the top surface 133 of the semiconductor die 130 and the top surface 143 of the mold material 140 may be optically-exposed to the outside through the optically-transmissive layer 170. In this manner, the optically-transmissive layer 170 may improve optical characteristics of the semiconductor die 130 via lenses, antireflective coatings, polarization coatings, filters, and/or refractive indices of the materials comprising the optically-transmissive layer 170.

The interposer 120 (or package or device 100) may, for example, be formed in a mass configuration (e.g., in a wafer, panel, strip, matrix, etc.) or as a single unit. In a scenario in which the interposer 120 (or package or device 100) is formed in a mass configuration, after the separating of the second WSS 2 (or before such separation), the interposer 120, the mold material 140, and/or the optically-transmissive layer 170 may be singulated or cut (e.g., sawn by a diamond blade or laser beam, snap-separated, pull-separated, etc.). In such a scenario, the side surfaces of the interposer 120, the mold material 140, and/or the optically-transmissive layer 170 may be made coplanar by such a singulation process. In an example scenario, a plurality of the packages or devices 100 may be placed (e.g., mold side down) on a saw tape, and then sawed. The saw may, for example, cut through the packages or devices 100 and partially through the saw tape. After sawing, the packages or devices 100 may be baked. After singulation, the individual packages or devices 100 may be individually inserted into trays (e.g., utilizing a pick and place process).

In accordance with the example illustrated in FIGS. 1A-1J and discussed herein, the present disclosure provides a semiconductor device 100 (and manufacturing method thereof) comprising the interposer 120, for example without a through silicon via. Such a semiconductor device 100 may, for example, be manufactured utilizing general bumping equipment, for example without utilizing complex and expensive through silicon via production processes. For example, according to various aspects of the present disclosure, a conductive layer having a relatively fine line/space/ thickness may be formed first on the carrier 110 (for example, a silicon wafer), and then such carrier 110 may be removed.

Figure 2:
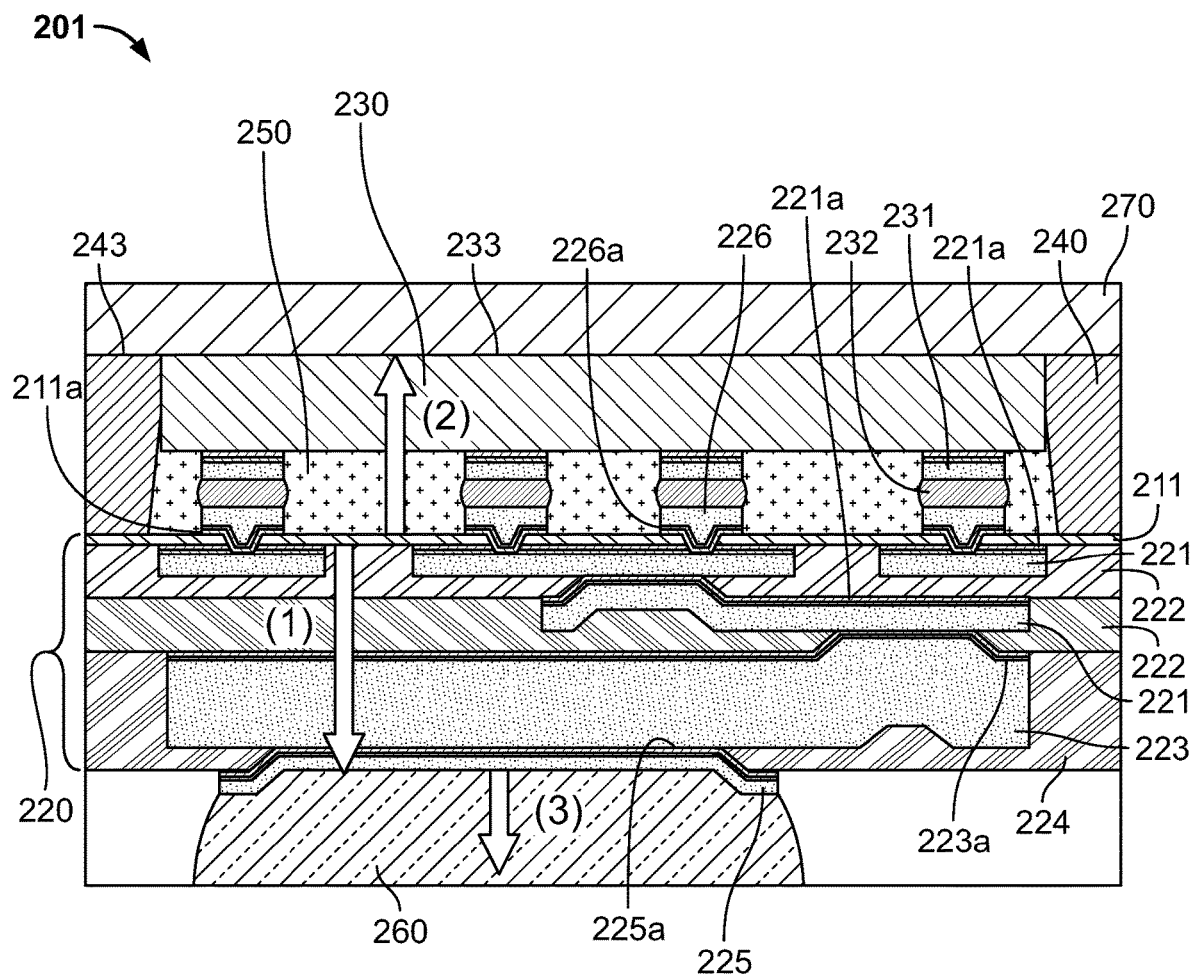
FIG. 2 shows a cross-sectional view illustrating a semiconductor device, in accordance with various aspects of the present disclosure.

Referring to FIG. 2, a cross-sectional view of the semiconductor device 201, in accordance with various aspects of the present disclosure, is shown. For illustrative clarity, only one conductive interconnection structure 260 is shown. As shown in FIG. 2, the example semiconductor device 201 may comprise an interposer 220, a semiconductor die 230, a mold material 240, an underfill 250, a conductive interconnection structure 260, and an optically-transmissive layer 270. The semiconductor device 201 may, for example, share any or all characteristics with any or all other semiconductor devices presented herein (e.g., the example semiconductor device 100 shown in FIGS. 1A-1J, etc.).

The interposer 220, or general grouping of layers, may for example comprise: a first seed layer 221a below a first dielectric layer 211 such as, for example, a silicon oxide layer and/or a silicon nitride layer; a first conductive layer 221 below the first seed layer 221a; a second dielectric layer 222 covering the first conductive layer 221 or portions thereof; a second seed layer 223a below the first conductive layer 221; a second conductive layer 223 below the second seed layer 223a; and a third dielectric layer 224 covering the second conductive layer 223 or portions thereof. The line/ space/thickness of the first conductive layer 221 may be smaller than those of the second conductive layer 223.

The interposer 220 may comprise the micro bump seed layer extending into and/or through the first dielectric layer 211 such as, for example, through an opening 211a formed therein and on the first seed layer 221a, a pad or micro bump pad 226 (hereinafter pad 226) on the micro bump seed layer 226a, an under bump seed layer 225a below the second conductive layer 223, and an under bump metal 225 below the under bump seed layer 225a. In an example implementation, the first seed layer and the micro bump seed layer are directly and electrically connected to each other.

As discussed, the term "interposer" may be utilized herein to conveniently group various layers for discussion. However, an interposer or interposer structure may comprise any of a variety of the layers discussed herein, and is not limited to any particular set of layers.

The conductive bump 231 may be on the semiconductor die 230, and the conductive bump 231 may be electrically connected to the pad 226 through the solder 232. The underfill 250 may be located between the semiconductor die 230 and the interposer 220 such as on the first dielectric layer 211, and the mold material 240 may surround side surfaces of the semiconductor die 230 and the underfill 250. In the illustrated example, since the mold material 240 surrounds only the side surfaces of the semiconductor die 230 but does not surround or cover the top surface 233, the top surface 233 of the semiconductor die 230 may be optically-exposed to the outside via the optically-transmissive layer 270. Furthermore, the top surface of the semiconductor die 230 and the top surface 243 of the mold material 240 may be coplanar.

The conductive interconnection structure 260 may, for example, be connected to the under bump metal 226 and may also be mounted on a substrate as discussed herein.

Labels (1), (2), and (3) shown in FIG. 2 may, for example, show a lamination and/or formation order. For example, in relation to the semiconductor device 200, in accordance with various aspects of the present disclosure, the interposer 220 may be formed in the direction (1) that builds from the first dielectric layer 211. Then, the semiconductor die 230 may be connected to the interposer 220 in the direction (2) that builds from the interposer 220. The conductive interconnection structure 260 may then be attached to the interposer 220 in the direction (3) that builds from the interposer 220.

Also, in comparison to the semiconductor device 100 discussed with regard to FIGS. 1A-1J, the example semiconductor device 200 comprises a pad 226 that is wider at a top end to be connected with a conductive bump 231 of the semiconductor die 230 than at a bottom end extending through the first dielectric layer 211. For example, rather than being cylindrically shaped as shown in the pad 126 of FIGS. 1G-1J, the pad 226 may be cup-shaped or mushroom-shaped with sloped stem sidewalls or vertical stem sidewalls. The pad 226 may also be formed with vertical cap sidewalls.

Referring to FIGS. 3A-3J, cross-sectional views illustrating a method of manufacturing a semiconductor device 300, in accordance with various aspects of the present disclosure is shown. The example semiconductor devices and/or methods illustrated in FIGS. 3A-3J may share any or all characteristics with any or all of the other example semiconductor devices and/or methods presented herein.

The example method of manufacturing the semiconductor device 300 may, for example, comprise providing a carrier 310, forming an under bump metal 321, forming a first conductive layer 323, forming a second conductive layer 325, forming a pad or micro bump pad 327 (hereinafter pad 327) attaching a semiconductor die 330, molding with a mold material 340, attaching a optically-transmissive layer 370 (e.g., a wafer, a panel, a singulated component of a wafer or panel, etc.), attaching a first WSS 1, removing the carrier 310, connecting a conductive interconnection structure 360, and separating the first WSS 1.

Figure 3A:
FIGS. 3A to 3J show cross-sectional views illustrating a method of manufacturing a semiconductor device, in accordance with various aspects of the present disclosure.
Figure 3B:
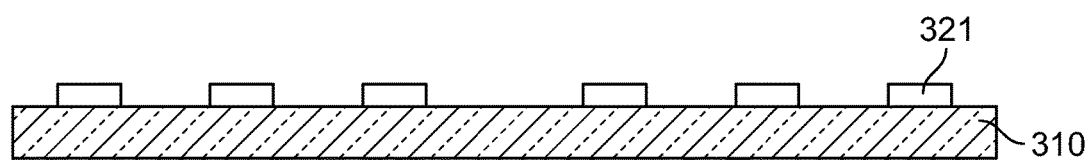

As shown in FIG. 3A, a carrier 310 may be provided that comprises a silicon (or semiconductor) wafer with a planar top surface and a planar bottom surface. As shown in FIG. 3B, an under bump metal 321 of at least one layer may be directly formed on the carrier 310. In one example implementation, the under bump metal 321 may be formed of any of a variety of materials, non-limiting examples of which are presented herein. For example, the under bump metal 321 may be formed of at least one of chrome, nickel, palladium, gold, silver, alloys thereof, combinations thereof, equivalents thereof, etc. The under bump metal 321 may, for example, comprise Ni and Au. The under bump metal 321 may also, for example, comprise Cu, Ni, and Au. The under bump metal 321 may be also formed utilizing any of a variety of processes, non-limiting examples of which are presented herein. For example, the under bump metal 321 may be formed utilizing one or more of an electroless plating process, electroplating process, sputtering process, etc. on the carrier 310. The under bump metal 321 may, for example, prevent or inhibit the formation of an intermetallic compound at the interface between the conductive interconnection structure 360 and the first conductive layer 323, thereby improving the reliability of the connection to the conductive interconnection structure 360. The under bump metal 321 may comprise multiple layers on the carrier 310. For example, the under bump metal 321 may comprise a first layer of Ni and a second layer of Au.

Figure 3C:
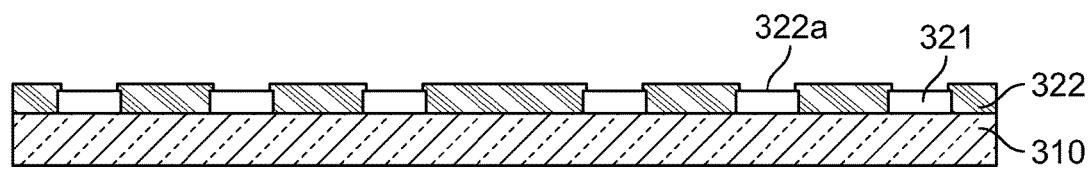

As shown in FIG. 3C, the under bump metal 321 may then be covered with a first dielectric layer 322 such as an organic layer (e.g., polymers such as polyimide, Benzocyclobutene (BCB), Polybenzoxazole (PBO), equivalents thereof, combinations thereof, etc.), which may also be referred to as a passivation layer. For example, the first dielectric layer 322 may be formed on the under bump metal 321 and the top surface of the carrier 310. The first dielectric layer 322 may be formed utilizing one or more of spin coating, spray coating, dip coating, rod coating, equivalents thereof, combinations thereof, etc., but the scope of the present disclosure is not limited thereto. As an example, the first dielectric layer 322 may be formed by laminating a dry film.

An opening 322a (or aperture) may, for example, be formed in the first dielectric layer 322, and a specific area of the under bump metal 321 (e.g., the entire top surface, a portion of the top surface, a center region of the top surface, etc.) may be exposed to the outside through the opening 322a. The opening 322a may be formed in any of a variety of manners (e.g., mechanical and/or laser ablation, chemical etching, photolithography, etc.). The first dielectric layer 322 (or any dielectric layer discussed herein) may also be originally formed having opening 322a, for example by masking, or other selective dielectric layer formation process.

Figure 3D:
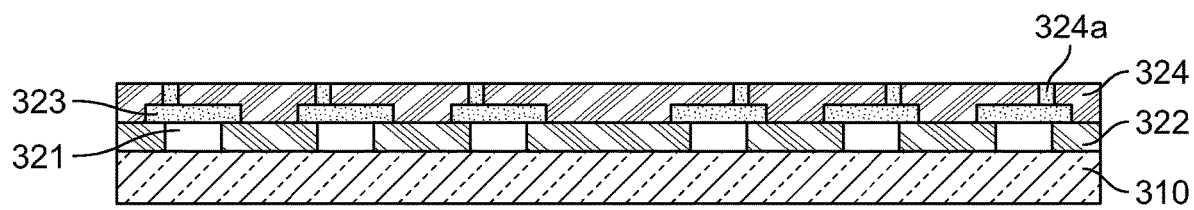

As shown in FIG. 3D, the first conductive layer 323 may be formed on the under bump metal 321 and the first dielectric layer 322. For example, the first conductive layer 323 may be coupled to the under bump metal 321. In one example implementation, a first seed layer, similar to a seed layer of FIG. 2, may be formed on the under bump metal 321 and the first dielectric layer 322. The first conductive layer 323 may then be formed on the first seed layer. The first conductive layer 323 and/or the forming thereof may, for example, share any or all characteristics with any other conductive layer and/or the forming thereof discussed herein.

The first conductive layer 323 may then be covered with a second dielectric layer 324. The second dielectric layer 324 may also be referred to as a passivation layer. The second dielectric layer 324 and/or the forming thereof may, for example, share any or all characteristics with any other dielectric layer and/or the forming thereof discussed herein.

An opening or aperture 324a may, for example, be formed in the second dielectric layer 324, and a specific area of the first conductive layer 323 may be exposed to the outside through the opening 324a. The opening 324a and/or the forming thereof may, for example, share any or all characteristics with any other dielectric layer opening and/or the forming thereof discussed herein.

In the example illustrated in FIG. 3, since the conductive interconnection structure 360 is later connected to the first conductive layer 323 via the under bump metal 321, the line/space/thickness of the first conductive layer 323 may, for example, be formed larger in comparison to the line/space/thickness of the second conductive layer 325 discussed below. The scope of this disclosure, however, is not limited to such relative dimensions.

Figure 3E:
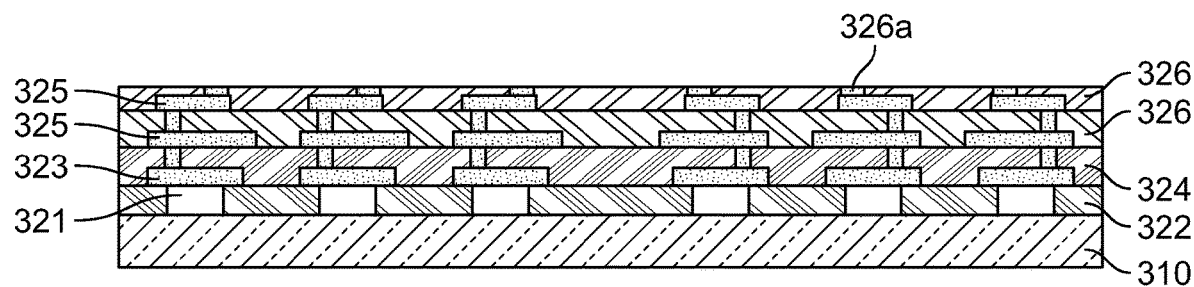

As shown FIG. 3E, a second conductive layer 325 may be formed on the first conductive layer 323 and/or on the second dielectric layer 324. In an example implementation, a second seed layer, similar to a seed layer of FIG. 2, may be formed on a top surface of the second dielectric layer 324 and/or in an opening or aperture 324a thereof that extends through the second dielectric layer 324 to the first conductive layer 323 (e.g., on side walls of the opening 324a). The second seed layer and/or the forming thereof may, for example, share any or all characteristics with any seed layer and/or the forming thereof discussed herein. The second conductive layer 325 may then be formed on the second seed layer. The second conductive layer 325 and/or the forming thereof may, for example, share any or all characteristics with any conductive layer and/or the forming thereof discussed herein. The second conductive layer 325 may then be covered with a third dielectric layer 326, which may also be referred to as a passivation layer. The third dielectric layer 326 and/or the forming thereof may, for example, share any or all characteristics with any dielectric layer and/or the forming thereof discussed herein. Also, an opening 326a may be formed in the third dielectric layer 326 so that a specific area of the second conductive layer 325 corresponding to the opening 326a is exposed to the outside. The opening 326a and/or the forming thereof may, for example, share any or all characteristics with any other dielectric layer opening and/or the forming thereof discussed herein.

Further, the forming of the second conductive layer 325 (e.g., with or without a seed layer) and the third dielectric layer 326 may be repeated any number of times (e.g., utilizing the same materials and/or processes or different respective materials and/or processes). The example illustrations in FIG. 3E shows two formations of such layers. As such, the layers are provided with similar labels in the figures (e.g., repeating the second conductive layer 325 and the third dielectric layer 326).

Figure 3F:
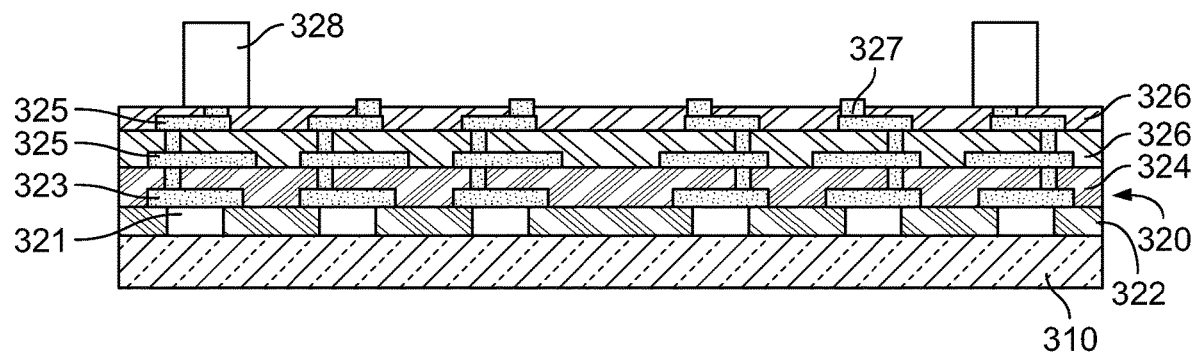

As shown in FIG. 3F, a micro bump pads, other pads, landings, attachment structures, or die attachment structures 327 may be formed in openings 326a so that each pad 327 is electrically connected to the second conductive layer 325. Furthermore, conductive vias 328 may be formed over openings 326a along the periphery of the device 300. In an example implementation, a seed layer, similar to a seed layer of FIG. 2, may be formed at the inside of the opening 326a (e.g., on the second conductive layer 325 exposed by the opening 326a and/or on side walls of the opening 326a) and/or outside of the opening 326a (e.g., along the top surface of the third dielectric layer 326). The seed layer and/or the forming thereof may share any or all characteristics with any other seed layer (e.g., micro bump seed layer, etc.) and/or the forming thereof discussed herein.

The pads 327 and the conductive vias 328 may then be formed on the seed layer. As shown, the conductive vias 328 in some embodiments may comprise conductive pillars. However, the conductive vias 328 in some embodiments may be through-mold-vias (TMVs), which may contain or be made of solder, wire, and/or pillars. Furthermore, such pillars may be plated. The seed layer may be interposed between the second conductive layer 325 and the conductive via 328. Each pad 327 and/or the forming thereof may share any or all characteristics with any other pad or micro bump pad and/or the forming thereof discussed herein. Similarly, each conductive via 328 and/or the forming thereof may share any or all characteristics with any other conductive via and/or the forming thereof discussed herein. The seed layer, pads 327, and/or conductive vias 328 may also be referred to herein as a conductive layer.

For discussion purposes herein, the under bump metal 321, the first dielectric layer 322, the first conductive layer 323, the second dielectric layer 324, the second conductive layer 325, the third dielectric layer 326, and the pad 327 may be considered to be components of an interposer 320.

Figure 3G:
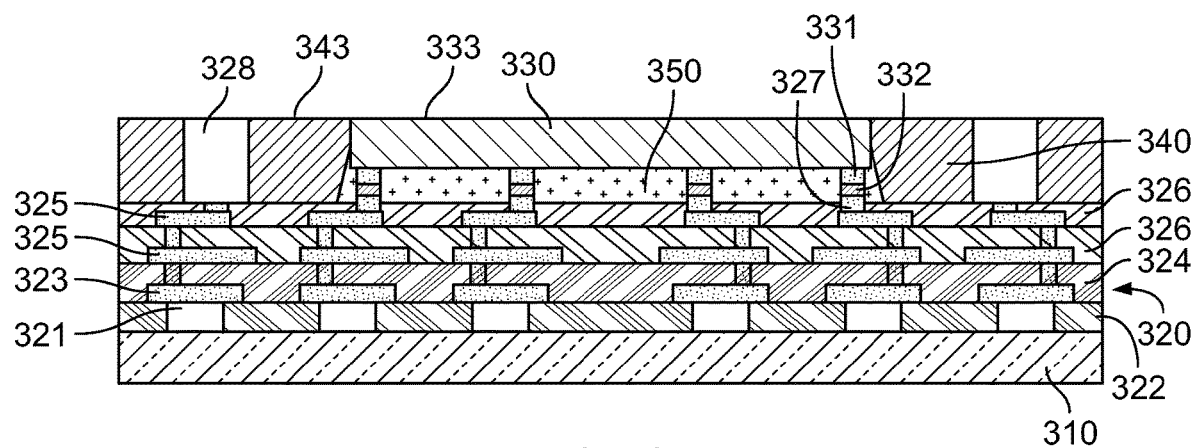

As shown in FIG. 3G, the semiconductor die 330 may be electrically connected to the pad 327 and may be molded with a mold material 340. For example, the conductive bump 331 (or other conductive attachment structure) of the semiconductor die 330 may be electrically connected to the pad 327 through the solder 332. The conductive bump 331 of the semiconductor die 330 may be attached to the pad 327 in any of a variety of manners, non-limiting examples of which are presented herein. For example, the conductive bump 331 may be soldered to the pad 327 utilizing any of a variety of solder attachment processes (e.g., a mass reflow process, a thermal compression process, etc.). Also for example, the conductive bump 331 may be coupled to the pad 327 utilizing a conductive adhesive, paste, etc. Additionally for example, the conductive bump 331 may be coupled to the pad 327 utilizing a direct metal-to-metal (e.g., solderless) bond. The conductive bump 331 and/or the forming thereof may, for example, share any or all characteristics with any conductive bump and/or the forming thereof discussed herein.

In an example implementation, an underfill 350 may be formed between the semiconductor die 330 and the interposer 320 (e.g., the third dielectric layer 326), for example, surrounding portions of the conductive bumps 331 and pads 327 that are exposed to (and thus encapsulated by) the underfill 350. The underfill 350 and/or the forming thereof may, for example, share any or all characteristics with any underfill and/or the forming thereof discussed herein.

In the molding or encapsulating process, the semiconductor die 330 and/or interposer 320 may be encapsulated with a mold material 340 (e.g., a molding resin or other mold material or encapsulant), which may then be cured. In an example implementation, the mold material 340 only covers the side surfaces of the vias 328 and the semiconductor die 330 (or only respective portions thereof), thus leaving the top surface of the vias 328 and the semiconductor die 330 exposed from the mold material 340. In another example implementation, the mold material 340 covers the side surfaces and the top surface of the semiconductor die 330. The mold material 340 and/or the forming thereof may, for example, share any or all characteristics with any mold material and/or the forming thereof discussed herein.

Figure 3H:
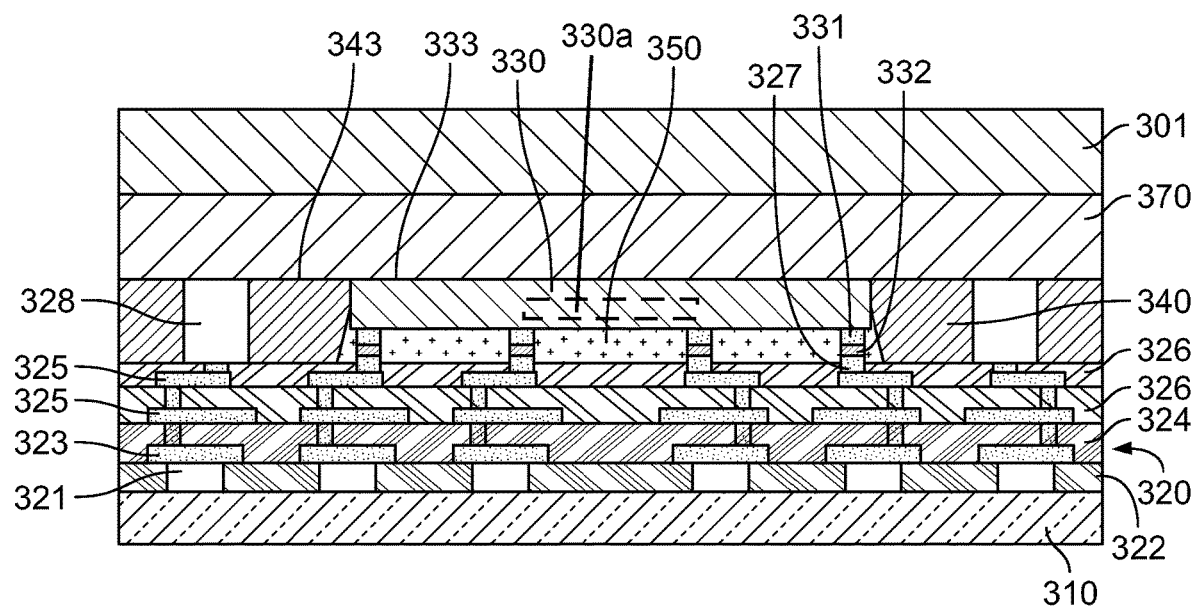

As shown in FIG. 3H, an optically transmissive layer 370 may be attached to the semiconductor die 330 and/or mold material 340 and a first WSS 301 may be attached to the optically transmissive layer 370. The optically transmissive 370 may include lenses, antireflective coatings, color filters, polarization layers, and/or layers of materials with different refractive indices in order to provide an upper or top surface 333 of the semiconductor die 330 with desired optical properties. For example, the semiconductor die 330 may comprise image sensors, receivers, transmitters, or other devices 330a that transmit or receive light. The optically transmissive layer 370 may help guide light to and/or from such devices of the semiconductor die 330.

As further shown in FIG. 3H, the first WSS 301 may be attached to the optically-transmissive layer 370. The WSS 301 may be attached to the optically-transmissive wafer 370 in any of a variety of manners, non-limiting examples of which are provided herein. For example, the WSS 301 or any WSS discussed herein may be attached to the optically-transmissive layer 370 utilizing a temporary adhesive that loses its adhesion when exposed to thermal energy or light energy, when exposed to particular chemicals, etc. One or more additional release layers may also be utilized to ease subsequent release of the WSS 301. The attachment process may, for example, comprise baking the assembly (e.g., at 250° for 30 mins, etc.). The WSS 301 may be formed from any of a variety of materials optically-transmissive materials such as glass. Though the WSS 301 is generally presented herein in the form of a wafer, the scope of this disclosure is not limited to such shape.

Figure 3I:
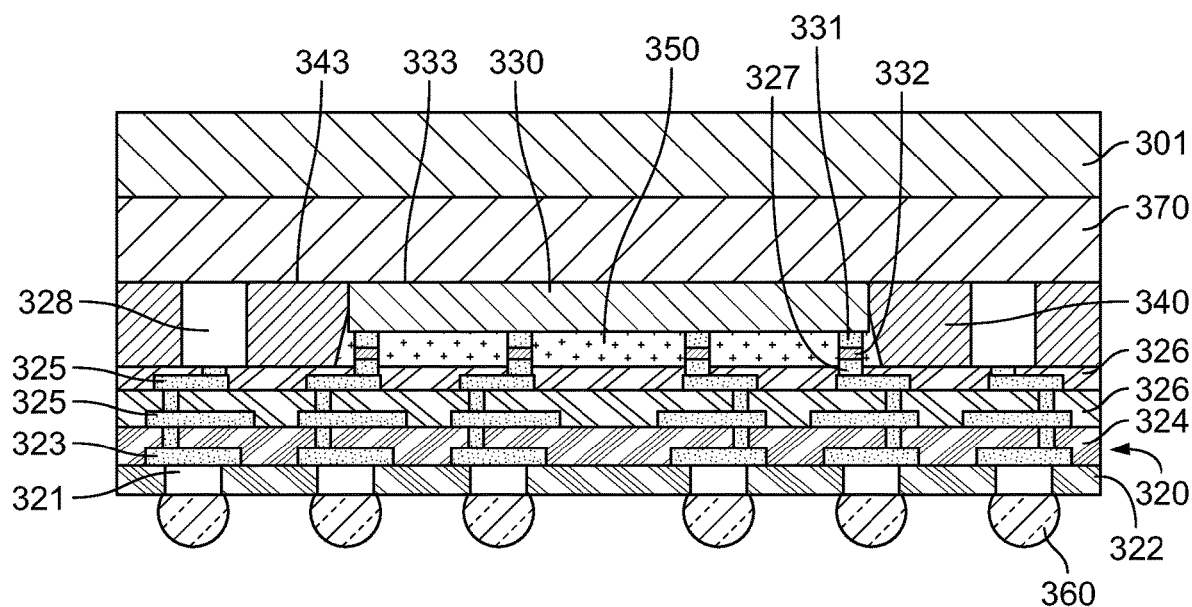

As shown in FIG. 3I, the carrier 310 may be removed from the under bump metal 321 and the first dielectric layer 322. For example, most or all of the carrier 310 may be removed through a mechanical grinding process. Any remaining carrier 310 may be removed through a chemical etching process. The removing of the carrier 310 may, for example, share any or all characteristics with any carrier removing discussed herein. In an example implementation, after removal of the carrier 310, the under bump metal 321 may be exposed to the outside through the first dielectric layer 322. The bottom surfaces of the under bump metal 321 may be coplanar with the bottom surface of the first dielectric layer 322.

As further shown in FIG. 3I, the conductive interconnection structure 360 (or a plurality thereof) is connected to the under bump metal 321. For example, the conductive interconnection structure 360 is electrically connected to the first conductive layer 323 via the under bump metal 321. The conductive interconnection structure 360 and/or the forming thereof may, for example, share any or all characteristics with any other interconnection structure and/or the forming thereof discussed herein.

Figure 3J:
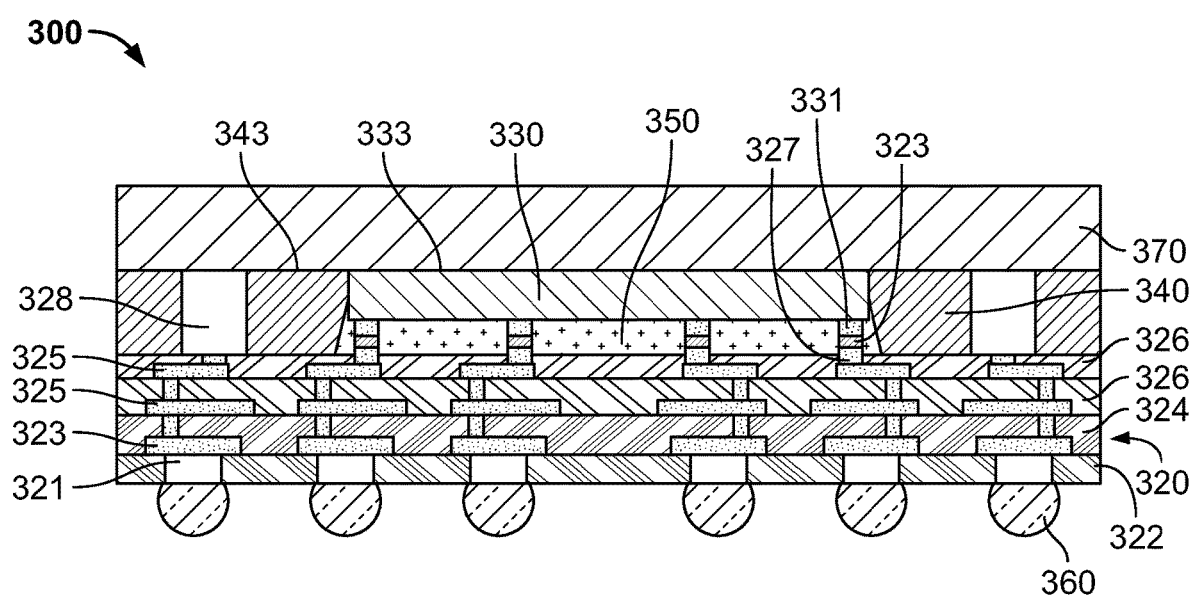

As shown in FIG. 3J, the WSS 301 may be separated from the optically-transmissive layer 370. The separating of the WSS 301 may, for example, share any or all characteristics with any wafer support system separating discussed herein.

In the completed example semiconductor device 300, the top surface 333 of the semiconductor die 330 may be coplanar with the top surface 343 of the mold material 340. Furthermore, the top surface 333 of the semiconductor die 330 and the top surface 343 of the mold material 340 may be optically-exposed to the outside through the optically-transmissive layer 370. In this manner, the optically-transmissive layer 370 may improve optical characteristics of the semiconductor die 330 via lenses, antireflective coatings, filters, and/or refractive indices of the materials comprising the optically-transmissive layer 370.

As described above, the example semiconductor device 300 according to various aspects of the present disclosure may be completed by forming the interposer on a carrier in a build-up or stack manner, electrically connecting the semiconductor die to the interposer, molding the semiconductor die with molding material, removing the carrier and forming the conductive interconnection structure on the interposer. Therefore, in the semiconductor device 300, misalignment between the first conductive layer and the under bump metal is reduced or eliminated. In addition, in the example semiconductor device 300, the under bump metal is first formed and the conductive layer, dielectric layer, and micro bump are then formed, thereby simplifying overall fabrication process of the semiconductor device 300.

Referring to FIGS. 4A-4F, cross-sectional views illustrating a method of manufacturing a semiconductor device 400, in accordance with various aspects of the present disclosure, are shown. The example semiconductor devices and/or methods illustrated at FIGS. 4A-4F may, for example, share any or all characteristics with any or all of the other example semiconductor devices and/or methods presented herein.

The example method of manufacturing the semiconductor device 400 may, for example, comprise providing a carrier 410, forming a first conductive layer 423 on the carrier 410, forming a pad, micro bump pad, or under bump metal 425 (hereinafter pad 425), attaching a semiconductor die 430, molding with a mold material 440, forming an under bump metal 465, and connecting a conductive interconnection structure 460.

Figure 4A:
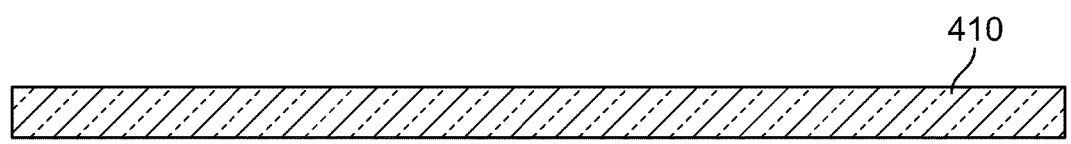
FIGS. 4A to 4F show cross-sectional views illustrating a method of manufacturing a semiconductor device, in accordance with various aspects of the present disclosure.

As shown in FIG. 4A, an optically-transmissive carrier 410 having a planar top surface and a planar bottom surface is provided. The carrier 410 in an example embodiment is provided by a glass wafer; however, other optically-transmissive materials such as polymers, oxides, and metals may be used. The carrier 410, and the providing or forming thereof, may for example share any or all characteristics with any carrier and discussed herein.

Figure 4B:
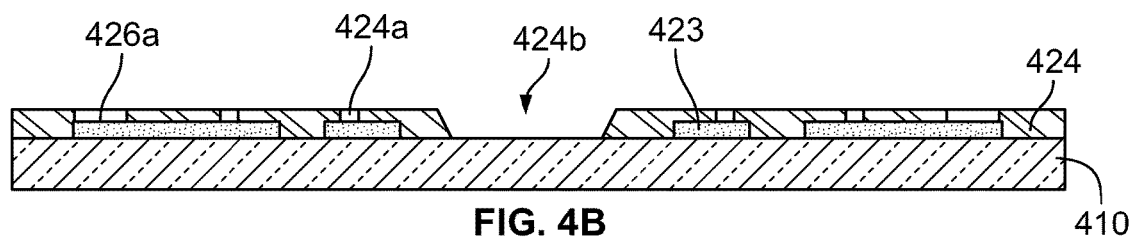

As shown in FIG. 4B, a first conductive layer 423 may be formed on the carrier 410. The first conductive layer 423 and/or the forming thereof may, for example, share any or all characteristics with any other conductive layer and/or the forming thereof discussed herein. In one example implementation, a first seed layer, similar to a seed layer of FIG. 2, may be formed on the optically-transmissive carrier 401, and the first conductive layer 423 may formed on the first seed layer. The first conductive layer 423 may then be covered with a first dielectric layer 424, which may be transparent, translucent, or otherwise optically-transmissive. An opening 424a may be formed in the first dielectric layer 424 so that a specific area of the first conductive layer 423 corresponding to the opening 424a is exposed to the outside. Moreover, an opening 424b may be formed in a central portion of the first dielectric layer 424 so that a central area of the carrier 410 is exposed. The first conductive layer 423, the first dielectric layer 424, and/or openings or apertures 424a therein, and/or the formation thereof, may share any or all characteristics with the other conductive layers, dielectric layers, and openings, and/or the formation thereof discussed herein. The forming of the first conductive layer 423, with or without a seed layer, and the first dielectric layer 424 may be repeated any number of times utilizing, for example, the same materials and/or processes or different respective materials and/or processes. The example illustrations in FIGS. 4B-4F show a single formation of such layers.

Figure 4C:
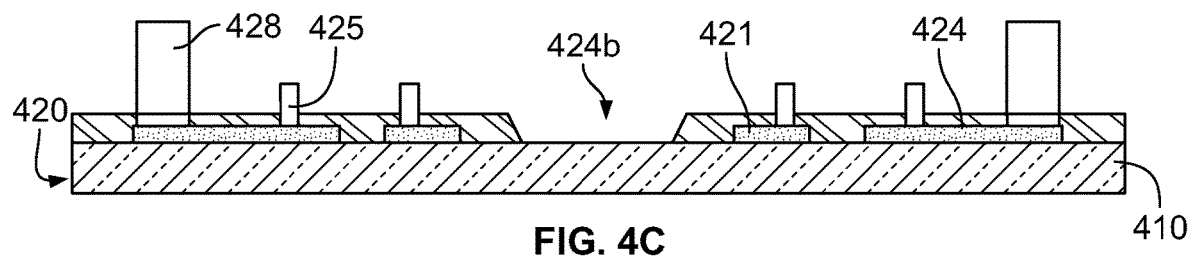

As shown in FIG. 4C, micro bump pads, other pads, landings, attachment structures, or die attachment structures 425 may be formed in the openings 424a so that each pad 425 is electrically connected to the second conductive layer 423. Furthermore, conductive vias 428 may be formed over openings 426a along the periphery of the device 400. In an example implementation, a seed layer, similar to a seed layer of FIG. 2, may be formed at the inside of the opening 424a (e.g., on the second conductive layer 423 exposed by the opening 424a and/or on side walls of the opening 424a) and/or outside of the opening 424a (e.g., on the top surface of the second dielectric layer 424). The seed layer may be formed utilizing the same material(s) and/or process(es) discussed herein with regard to other seed layers, or may be formed utilizing different respective material(s) and/or process(es).

The pads 425 and the conductive vias 428 may then be formed on the seed layer. As shown, the conductive vias 428 in some embodiments may comprise conductive pillars. However, the conductive vias 428 in some embodiments may be through-mold-vias (TMVs), which may contain or be made of solder, wire, and/or pillars. Furthermore, such pillars may be plated. In an example implementation, the seed layer may be interposed between the second conductive layer 423 and each pad 425. Similarly, the seed layer may be interposed between the second conductive layer 423 and each conductive via 428. Each pad 425 and/or the forming thereof may share any or all characteristics with any other pad or micro bump pad and/or the forming thereof discussed herein. Similarly, each conductive via 428 and/or the forming thereof may share any or all characteristics with any other conductive via and/or the forming thereof discussed herein. The seed layer, pads 425, and/or conductive vias 428 may also be referred to herein as a conductive layer.

Though not illustrated in FIGS. 4A-4F, following formation of the pad 425, an edged trim or profile process may be performed, for example in which an edge of the wafer being processed is trimmed or profiled. Such trimming may be performed in a variety of manners, for example by grinding.

Such edge trimming may, for example, protect the wafer from chipping and flaking during subsequent processing.

Figure 4D:
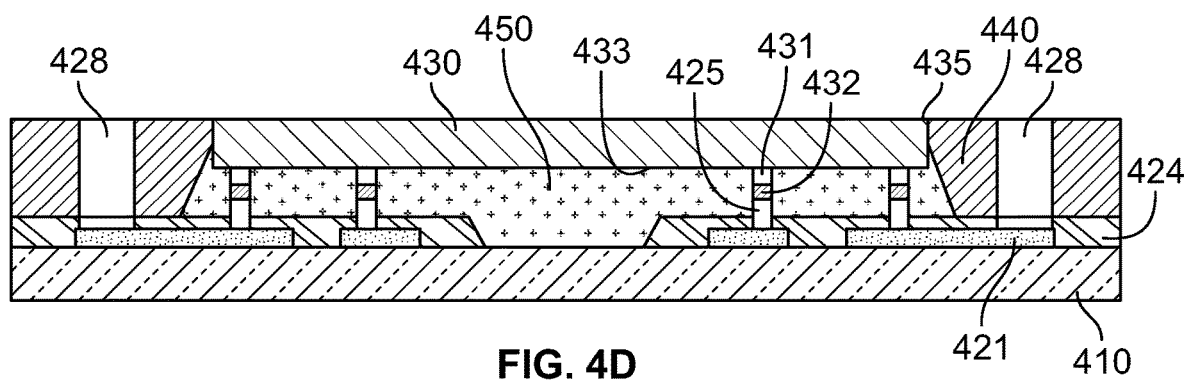

As shown in FIG. 4D, a semiconductor die 430 may be electrically connected to the pad 425 and may be molded with a mold material 440. The semiconductor die 430 and/or the attaching thereof may share any or all characteristics with other semiconductor dies and/or the attaching thereof discussed herein. For example, in an example scenario, a solder paste may be applied to each pad 425 utilizing a stencil and squeegee, each conductive bump 431 of the semiconductor die 430 may be positioned on or in the solder paste (e.g., utilizing a pick-and-place process), and the solder paste may then be reflowed. After attachment of the semiconductor die 430, the assembly may be cleaned (e.g., with hot DI water, etc.), subjected to a flux clean and bake process, subjected to a plasma treatment process, etc.

For example, each conductive bump 431 or other conductive attachment structure of the semiconductor die 430 may be electrically connected to a respective pad 425 through the solder 432. Each conductive bump 431 of the semiconductor die 430 may be attached to a respective pad 425 or other pad or landing structure in any of a variety of manners, non-limiting examples of which are presented herein. For example, each conductive bump 431 may be soldered to the pad 425 utilizing any of a variety of solder attachment processes (e.g., a mass reflow process, a thermal compression process, etc.), etc. Also for example, the conductive bump 431 may be coupled to the pad 425 utilizing a conductive adhesive, paste, etc. Additionally for example, each conductive bump 431 may be coupled to a respective pad 425 utilizing a direct metal-to-metal (e.g., solderless) bond.

In an example implementation, an optically-transmissive underfill 450 may be formed between the semiconductor die 430 and the second dielectric layer 424 and/or carrier 410 surrounding portions of the conductive bumps 431 and pads 425 that are exposed to the underfill 450. As shown, the underfill 450 may fill the opening 424b which exposes a lower surface 433 to the carrier 410. The underfill 450, or the formation thereof, may share any or all characteristics with other underfills discussed herein, except that the underfill 450 is optically-transmissive to permit the passage of light between a lower surface 433 of the semiconductor die 430 and the optically-transmissive carrier 410. In some embodiments, the underfill 450 may comprise an optically-transmissive silicone material.

In the molding process, the semiconductor die 430 and/or interposer 420 may be encapsulated with a mold material 440 such as, for example, a molding resin or other mold material or encapsulant, which may then be cured. The mold material 440 and/or the forming thereof, may share any or all characteristics with other mold materials and/or the forming thereof discussed herein. In an example implementation, the mold material 440 covers the side surfaces and top surface of the semiconductor die 430. In another example implementation, the mold material 440 only covers the side surfaces of the semiconductor die 430 (or only respective portions thereof), thus leaving the top surface of the semiconductor die 430 exposed from the mold material 440. If the mold material 440 is optically-transmissive then as discussed herein, the mold material 440 may also be utilized to form a molded underfill, for example instead of the underfill 450.

The mold material 440, the semiconductor die 430, and the conductive vias 428 may be ground such that a top surface of the mold material 440 is coplanar with the top surface 435 of the semiconductor die 430 and the top surface of the conductive vias 428 as shown. In some embodiments, the mold material 440 may cover the top surface 435. In which case the mold material 440 and conductive vias 428 may be ground such that a top surface of the mold material 440 is coplanar with the top surface of the conductive vias 428. In yet another embodiment, a top surface of the mold material 440 may not be coplanar with a top surface 435 of the semiconductor die 430. In such an embodiment, the mold material 440 and semiconductor die 430 may be covered with a passivation layer such as, for example, a third dielectric layer 454 as shown in FIG. 4F, which may provide a planar surface upon which to form further layers of the device 400.

Figure 4E:
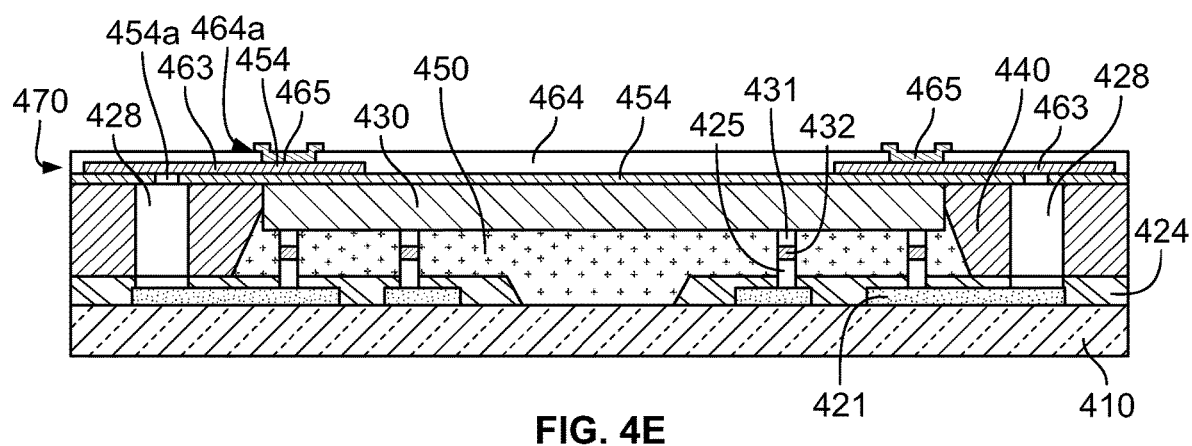
Figure 4F:
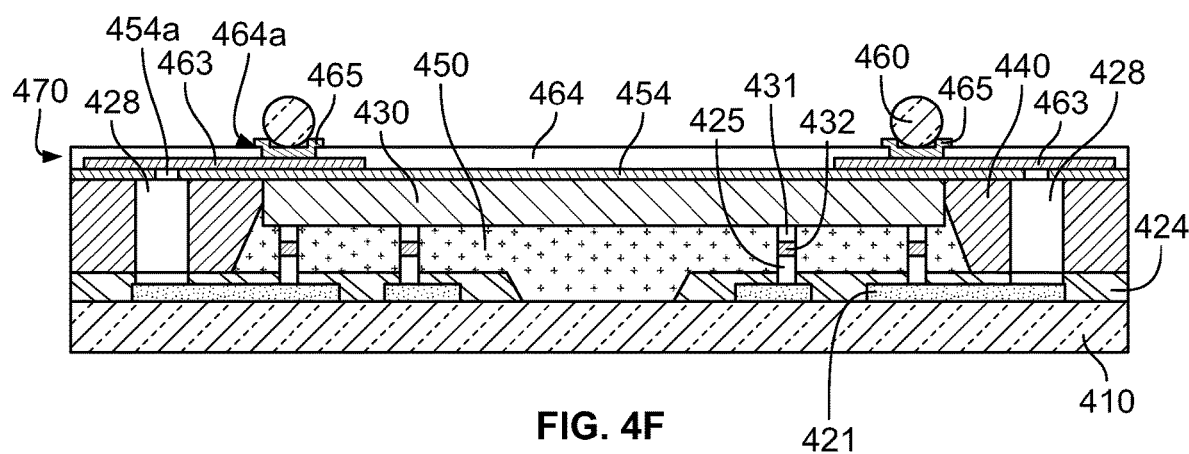

As shown in FIG. 4E, an upper surface of the mold material 440, semiconductor die 430, and/or the conductive vias 428 may be covered with a second dielectric layer 454. Also, an opening 454a may be formed in the second dielectric layer 454 to expose conductive vias 428. A second conductive layer 463 may be formed on the conductive vias 428 and/or on the second dielectric layer 454. In one example implementation, a second seed layer (not shown) may be formed at the inside of the opening 454a such as, for example, on side walls of the opening 454a formed in the second dielectric layer 454 and/or on the conductive vias 428 exposed by the opening 454a. In addition to or alternatively, the second seed layer may be formed outside of the opening 454a such as, for example, on the top surface of the second dielectric layer 454. As discussed herein, the second seed layer may be formed using the same materials and/or processes as used to form the first seed layer, or may be formed using different respective materials and/or processes. The second seed layer or any seed layer discussed herein may also be referred to herein as a conductive layer.

Continuing the example implementation, the second conductive layer 463 may be formed on the second seed layer. For example, the second conductive layer 463 may be formed to fill or at least cover side surfaces of the opening 454a in the second dielectric layer 454. The second conductive layer 463 may be formed using the same materials and/or processes as the first conductive layer 421, or may be formed using different respective materials and/or processes. The second conductive layer 463 may also be referred to herein as a redistribution layer.

The second conductive layer 463 may then be covered with a fourth dielectric layer 464. The fourth dielectric layer 464 and/or the forming thereof may share any or all characteristics with other dielectric layers and/or the forming thereof discussed herein. An opening or aperture 464a may be formed in the fourth dielectric layer 464, and a specific area of the second conductive layer 463 may be exposed to the outside through the opening 464a. The opening 464a may be formed in any of a variety of manners such as, for example, mechanical and/or laser ablation, chemical etching, etc. Alternatively, for example, the fourth dielectric layer 464 may be originally formed with the opening 464a therein.

An under bump seed layer may be formed at the inside of the opening 464a and/or outside of the opening 464a. The under bump seed layer and/or the forming thereof may share any or all characteristics with any other under bump seed layer and/or the forming thereof discussed herein. An under bump metal 465 may be formed on the under bump seed layer. The under bump metal 465 and/or the forming thereof may, for example, share any or all characteristics with any under bump metal and/or the forming thereof.

As shown in FIG. 4F, a conductive interconnection structure 460 may be attached to the under bump metal 465. The conductive interconnection structure 460 and/or the attachment thereof may share any or all characteristics with other conductive interconnection structures and/or the attachment thereof discussed herein. As shown, the under bump metal 465 may be formed on the opening 464a of the fourth dielectric layer 464 and the conductive interconnection structure 460 may connected to the under bump metal 465. Moreover, the second conductive layer 463 may electrically connect the under bump metal 465 to the conductive vias 428 which may likewise be electrically connected to the first conductive layer 421 and/or the second conductive layer 423. As such, the conductive interconnection structure 460 may be electrically connected to semiconductor die 430 via one or more of the conductive layers 421, 423, 463 and/or the conductive vias 428.

For discussion purposes herein, the first conductive layer 421, the first dielectric layer 422, the second conductive layer 423, and the second dielectric layer 424 may be considered to be components of a first interposer 420. Furthermore, the above-mentioned pads 425 also may be considered to be components of the first interposer 420. Similarly, for discussion purposes herein, the under bump metal 465 and fourth dielectric layer 464 may be considered to be components of a second interposer 470.

In the completed example semiconductor device 400, the bottom surface 433 of the semiconductor die 430 may be optically-exposed to the outside through the optically-transmissive underfill 450, the optically-transmissive carrier 410, and optically transmissive dielectric layers 422 and 424. As such, the optically-transmissive carrier 410 may improve optical characteristics of the semiconductor die 430 via lenses, antireflective coatings, filters, and/or refractive indices of the materials comprising the optically-transmissive carrier 410.

As with any or all of the examples discussed herein, the interposer 420 or package 400 may be formed in a mass configuration or as a single unit. As discussed herein, in an example scenario in which the interposer 420 or package 400 is formed in a mass configuration, a singulation process may be performed.

Figure 5:
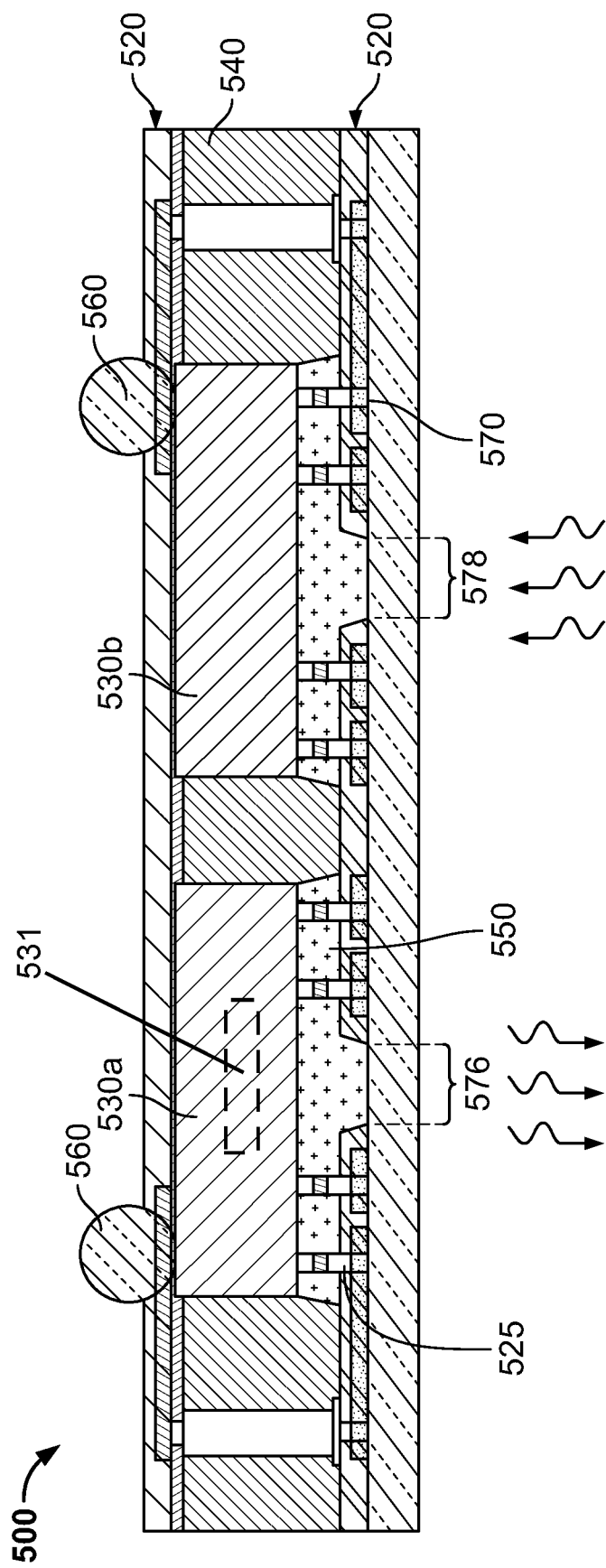
FIG. 5 shows a cross-sectional view illustrating a semiconductor device, in accordance with various aspects of the present disclosure.

Referring to FIG. 5, a cross-sectional view of a semiconductor device 500, in accordance with various aspects of the present disclosure, is shown. As shown in FIG. 5, the semiconductor device 500 may be constructed in a manner similar to the semiconductor device 400 of FIGS. 4A-4F. The semiconductor device 500, however, includes a plurality of semiconductor dies 530 which are optically isolated from each other via mold material 540. Besides the plurality of semiconductor dies 530, the semiconductor device 500, similar to the semiconductor device 400, may comprise an interposer 520, a mold material 540, an optically-transmissive underfill 550, a conductive interconnection structure 560, and an optically-transmissive layer 570. The semiconductor device 500 may, for example, share any or all characteristics with any or all other semiconductor devices presented herein.

Each semiconductor die 530 may include optical sensors, optical receivers, optical transmitters, or other optical devices that transmit, receive, detect, and/or sense light. In some embodiments, one semiconductor die 530a may include one or more optical transmitters 531 configured to transmit or emit light through the optically transmissive underfill 550 and optically transmissive layer 570. To this end, pads or micro bump pads 525 (hereinafter pads 525) may be positioned toward a periphery of the semiconductor die 530a and outside a transmission region or window 576 of the optically transmissive layer 570 through which the optical transmitter transmits light. Furthermore, another semiconductor die 530b may include one or more optical receivers configured to receive light through the optically transmissive underfill 550 and optically transmissive layer 570. To this end, the pads 525 may be positioned toward a periphery of the semiconductor die 530b and outside a reception region or window 578 of the optically transmissive layer 570 through which the optical transmitter receives light.

In summary, various aspects of this disclosure provide a method for manufacturing a semiconductor device in which the method comprises providing an interposer without through silicon vias and/or an optically-transmissive carrier, wafer, or layer. Various aspects of this disclosure also provide a semiconductor device comprising an interposer without through silicon vias and/or an optically-transmissive carrier, wafer, or layer. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor device, comprising:
   a transmissive layer comprising a transmissive layer first side and a transmissive layer second side opposite the transmissive layer first side, wherein the transmissive layer permits passage of radiation between the transmissive layer first side and the transmissive layer second side;
   a first redistribution structure comprising a first redistribution structure first side, a first redistribution structure second side opposite the first redistribution structure first side, and a first redistribution structure opening that extends through the first redistribution structure first side to the first redistribution structure second side and exposes a portion of the transmissive layer first side, wherein the first redistribution structure first side comprises first conductive pads; and
   a first component comprising a first component first side, a first component second side opposite the first component first side, and a first radiation circuit, wherein the first component second side is coupled to the first conductive pads of the first redistribution structure first side, and wherein the first radiation circuit is vertically aligned with the first redistribution structure opening to permit radiation to pass between the first radiation circuit and a portion of the transmissive layer via the first redistribution structure opening.

2. The semiconductor device of claim 1, comprising an underfill material between the first component second side and the first redistribution structure first side.

3. The semiconductor device of claim 2, wherein the underfill material extends between the first radiation circuit and the transmissive layer.

4. The semiconductor device of claim 3, wherein the underfill material fills the first redistribution structure opening and contacts the transmissive layer.

5. The semiconductor device of claim 1, comprising:
   a second redistribution structure; and
   conductive vias that couple the second redistribution structure to the first redistribution structure.

6. The semiconductor device of claim 5, wherein the first component is between the first redistribution structure and the second redistribution structure.

7. The semiconductor device of claim 5, comprising:
conductive interconnect structures coupled to the second redistribution structure; and
wherein the conductive interconnect structures provide electrical paths to the first component that pass through the second redistributions structure, the conductive vias, and the first redistribution structure.

8. The semiconductor device of claim 1, wherein the first radiation circuit comprises a sensor radiation circuit configured to receive radiation passing through the transmissive layer and the first redistribution structure opening.

9. The semiconductor device of claim 1, wherein the first radiation circuit comprises a transmitter radiation circuit configured to transmit radiation through the first redistribution structure opening the transmissive layer.

10. The semiconductor device of claim 1, comprising:
a second component coupled to second conductive pads of the first redistribution structure first side;
wherein the second component comprises a second radiation circuit;
wherein the first radiation circuit comprises a sensor radiation circuit; and
wherein the second radiation circuit comprises a transmitter radiation circuit.

11. A semiconductor device, comprising:
a redistribution structure comprising a plurality of conductive layers and plurality of dielectric layers between a redistribution structure first side and a redistribution structure second side that is opposite the redistribution structure first side;
conductive interconnection structures below the redistribution structure second side;
a component comprising a first radiation circuit, wherein the component comprises a component first side, a component second side opposite the component first side, and a component sidewall that joins the component first side to the component second side;
conductive bumps between the redistribution structure first side and the component second side, wherein the conductive bumps coupled the component second side to the redistribution structure first side;
a mold material that contacts the redistribution structure first side and the component sidewall; and
a transmissive layer comprising a transmissive layer first side and a transmissive layer second side opposite the transmissive layer first side, wherein the transmissive layer second side faces the component first side, and wherein the transmissive layer permits passage of radiation between the transmissive layer first side and the transmissive layer second side.

12. The semiconductor device of claim 11, wherein the mold material contacts the transmissive layer second side.

13. The semiconductor device of claim 11, comprising:
underfill material between the redistribution structure first side and the component second side; and
wherein the underfill material contacts the conductive bumps.

14. The semiconductor device of claim 13, wherein the mold material contacts the underfill material.

15. The semiconductor device of claim 13, wherein the mold material comprises a material different than the underfill material.

16. The semiconductor device of claim 11, wherein:
the redistribution structure comprises a redistribution structure lateral side between the redistribution structure first side and the redistribution structure second side; and
the redistribution structure lateral side is coplanar with a lateral side of the mold material.

17. A method of manufacturing a semiconductor device, the method comprising:
providing a first redistribution structure comprising a first redistribution structure first side, a first redistribution structure second side opposite the first redistribution structure first side, and a first redistribution structure opening that extends through the first redistribution structure first side to the first redistribution structure second side, wherein the first redistribution structure first side comprises first conductive pads;
providing a transmissive layer comprising a transmissive layer first side and a transmissive layer second side opposite the transmissive layer first side; and
providing a first component comprising a first component first side, a first component second side opposite the first component first side, and a first radiation circuit, wherein the first component second side is coupled to the first conductive pads of the first redistribution structure first side, and wherein the first radiation circuit is vertically aligned with the first redistribution structure opening to permit radiation to pass between the first radiation circuit and a portion of the transmissive layer via the first redistribution structure opening.

18. The method of claim 17, providing an underfill material between the first component second side and the first redistribution structure first side.

19. The method of claim 18, wherein the underfill material fills the first redistribution structure opening and contacts the transmissive layer.

20. The method of claim 17, comprising providing a second redistribution structure coupled to the first redistribution structure by conductive vias such that the first component lies between the first redistribution structure and the second redistribution structure.

\* \* \* \* \*